US012666625B2

(12) United States Patent
Lim et al.

(10) Patent No.: US 12,666,625 B2
(45) Date of Patent: Jun. 23, 2026

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Suhwan Lim, Suwon-si (KR); Yongseok Kim, Suwon-si (KR); Juhyung Kim, Suwon-si (KR); Minjun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 292 days.

(21) Appl. No.: 18/222,278

(22) Filed: Jul. 14, 2023

(65) Prior Publication Data

US 2024/0023340 A1 Jan. 18, 2024

(30) Foreign Application Priority Data

Jul. 14, 2022 (KR) ........................ 10-2022-0087006

(51) Int. Cl.
H10B 51/30 (2023.01)
H10B 41/10 (2023.01)
(Continued)

(52) U.S. Cl.
CPC ............. H10B 51/30 (2023.02); H10B 41/10 (2023.02); H10B 41/27 (2023.02); H10B 41/35 (2023.02);
(Continued)

(58) Field of Classification Search
CPC ........ H10B 51/30; H10B 41/10; H10B 41/27; H10B 41/35; H10B 41/40; H10B 43/10;
(Continued)

(56) References Cited

U.S. PATENT DOCUMENTS

| | | | |
|---|---|---|---|
| 10,727,241 B2 | 7/2020 | Dasgupta et al. | |
| 10,825,831 B1 | 11/2020 | Koval et al. | |
| (Continued) | | | |

FOREIGN PATENT DOCUMENTS

| | | |
|---|---|---|
| KR | 10-1872122 B1 | 6/2018 |
| KR | 10-2021-0079401 A | 6/2021 |

OTHER PUBLICATIONS

Communication dated Dec. 1, 2023, issued by the European Patent Office in counterpart European Application No. 23185512.3.
(Continued)

*Primary Examiner* — Allison Bernstein
(74) *Attorney, Agent, or Firm* — Sughrue Mion, PLLC

(57) ABSTRACT

The present disclosure provides methods, apparatuses, and systems for operating and manufacturing a semiconductor device. In some embodiments, a semiconductor device includes a stack structure including interlayer insulating layers and gate electrodes, a channel layer disposed inside a hole penetrating through the stack structure, a data storage layer disposed between the stack structure and the channel layer, data storage patterns disposed between the data storage layer and the gate electrodes, and dielectric layers disposed between the data storage patterns and the gate electrodes. The interlayer insulating layers and the gate electrodes are alternately and repeatedly stacked in a first direction. A first material of the data storage layer is different from a second material of the data storage patterns.

19 Claims, 18 Drawing Sheets

(51) Int. Cl.

| | |
|---|---|
| *H10B 41/27* | (2023.01) |
| *H10B 41/35* | (2023.01) |
| *H10B 41/40* | (2023.01) |
| *H10B 43/10* | (2023.01) |
| *H10B 43/27* | (2023.01) |
| *H10B 43/35* | (2023.01) |
| *H10B 43/40* | (2023.01) |
| *H10B 51/10* | (2023.01) |
| *H10B 51/40* | (2023.01) |
| *H10B 80/00* | (2026.01) |
| *H10W 90/00* | (2026.01) |

(52) U.S. Cl.
CPC ............. *H10B 41/40* (2023.02); *H10B 43/10* (2023.02); *H10B 43/27* (2023.02); *H10B 43/35* (2023.02); *H10B 43/40* (2023.02); *H10B 51/10* (2023.02); *H10B 51/40* (2023.02); *H10B 80/00* (2023.02); *H10W 90/00* (2026.01); *H10W 90/752* (2026.01)

(58) Field of Classification Search
CPC ........ H10B 43/27; H10B 43/35; H10B 43/40; H10B 51/10; H10B 51/40; H10B 80/00; H10B 51/20; H10B 41/30; H10B 41/50; H10B 43/50; H10B 51/50; H01L 25/0652; H01L 2225/06506; H10D 64/035; H10D 64/037; H10D 64/033
See application file for complete search history.

(56) References Cited

U.S. PATENT DOCUMENTS

| | | | |
|---|---|---|---|
| 10,916,654 B2 | 2/2021 | Fujii | |
| 10,937,809 B1 | 3/2021 | Sharangpani et al. | |
| 11,195,858 B2 | 12/2021 | Suzuki et al. | |
| 11,309,332 B2 | 4/2022 | Rajashekhar et al. | |
| 2012/0205722 A1* | 8/2012 | Lee ........................ | H10B 43/35 257/773 |
| 2019/0304986 A1 | 10/2019 | Dong et al. | |
| 2020/0211651 A1* | 7/2020 | Park ................... | G11C 16/0483 |
| 2020/0243498 A1* | 7/2020 | Zhang ................... | H10B 41/41 |
| 2021/0111190 A1* | 4/2021 | Lee ........................ | H10B 43/27 |
| 2021/0175253 A1 | 6/2021 | Han et al. | |
| 2022/0020771 A1 | 1/2022 | Yang et al. | |
| 2022/0181353 A1 | 6/2022 | Lee et al. | |

OTHER PUBLICATIONS

Communication dated Oct. 2, 2025, issued by the European Patent Office in European Application No. 23 185 512.3.

* cited by examiner

'A'

SEMICONDUCTOR DEVICE AND DATA STORAGE SYSTEM INCLUDING THE SAME

CROSS-REFERENCE TO RELATED APPLICATION(S)

This application claims benefit of priority under 35 U.S.C. § 119 to Korean Patent Application No. 10-2022-0087006, filed on Jul. 14, 2022, in the Korean Intellectual Property Office, the disclosure of which is incorporated herein by reference in its entirety.

BACKGROUND

1. Field

The present disclosure relates to a semiconductor device, a method of operating the semiconductor device, a data storage system including the semiconductor device, and a manufacturing method thereof.

2. Description of Related Art

Electronic systems requiring data storage require semiconductor devices capable of storing high-capacity data. Accordingly, a method for increasing data storage capacity of semiconductor devices has been researched. For example, a semiconductor device including memory cells arranged three-dimensionally, instead of memory cells arranged two-dimensionally, has been proposed as a method for increasing data storage capacity of semiconductor devices.

SUMMARY

Example embodiments provide a semiconductor device in which a memory window is increased, when compared to related semiconductor devices.

Example embodiments provide a data storage system including the semiconductor device.

Example embodiments provide a method of operating the semiconductor device.

Example embodiments provide a method of forming the semiconductor device.

According to an aspect of the present disclosure, a semiconductor device is provided. The semiconductor device includes a stack structure including interlayer insulating layers and gate electrodes, a channel layer disposed inside a hole penetrating through the stack structure, a data storage layer disposed between the stack structure and the channel layer, data storage patterns disposed between the data storage layer and the gate electrodes, and dielectric layers disposed between the data storage patterns and the gate electrodes. The interlayer insulating layers and the gate electrodes are alternately and repeatedly stacked in a first direction. A first material of the data storage layer is different from a second material of the data storage patterns.

According to an aspect of the present disclosure, a semiconductor device is provided. The semiconductor device includes a core pattern including an insulating material, a channel layer surrounding a side surface of the core pattern, a data storage layer surrounding an outer surface of the channel layer, a data storage pattern surrounding an outer surface of the data storage layer, a first dielectric layer surrounding an outer surface of the data storage pattern, and a gate electrode surrounding an outer surface of the first dielectric layer. A first material of the data storage layer is different from a second material of the data storage pattern.

According to an aspect of the present disclosure, a data storage system is provided. The data storage system includes a semiconductor device including an input/output (I/O) pad, and a controller electrically coupled to the semiconductor device via the I/O pad and configured to control the semiconductor device using the I/O pad. The semiconductor device further includes a stack structure including interlayer insulating layers and gate electrodes, a channel layer disposed inside a hole penetrating through the stack structure, a data storage layer disposed between the stack structure and the channel layer, data storage patterns disposed between the data storage layer and the gate electrodes, and dielectric layers disposed between the data storage patterns and the gate electrodes. The interlayer insulating layers and the gate electrodes are alternately and repeatedly stacked. A first material of the data storage layer is different from a second material of the data storage patterns.

According to an aspect of the present disclosure, a method of operating a semiconductor device is provided. The method of operating the semiconductor device includes performing a write operation on a memory cell transistor of the semiconductor device. The write operation includes lowering a threshold voltage of the memory cell transistor by allowing first electrons in a floating gate to be ejected to a gate electrode, and lowering the threshold voltage of the memory cell transistor to a first level that causes a ferroelectric layer of the memory cell transistor to transition into a first polarization state. The method of operating the semiconductor device includes performing an erase operation on the memory cell transistor. The erase operation includes increasing the threshold voltage of the memory cell transistor by injecting second electrons into the floating gate, and increasing the threshold voltage of the memory cell transistor to a second level that causes the ferroelectric layer to transition into a second polarization state. The second polarization state is different than the first polarization state.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description, taken in conjunction with the accompanying drawings, in which.

DETAILED DESCRIPTION

Figure 1:
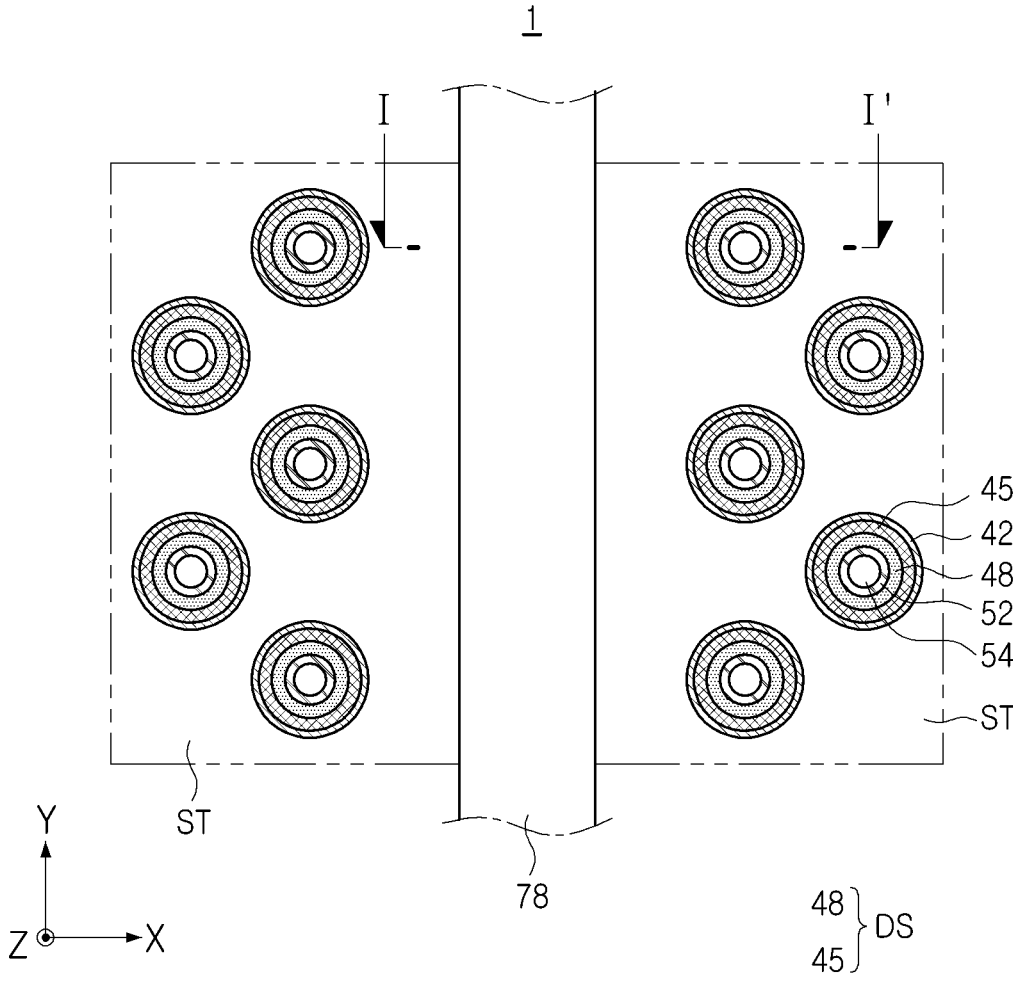
FIGS. 1 to 2B are diagrams schematically illustrating an example of a semiconductor device, according to an example embodiment of the present disclosure.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below,"

"under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

A semiconductor device, according to an example embodiment of the present disclosure, is described with reference to FIGS. 1 to 2B. FIG. 1 is a top view schematically illustrating a semiconductor device, according to an example embodiment of the present disclosure, FIG. 2A is a cross-sectional view schematically illustrating a region taken along line I-I' of FIG. 1, and FIG. 2B is a partially enlarged cross-sectional view illustrating a region 'A' of FIG. 2A.

Figure 2A:
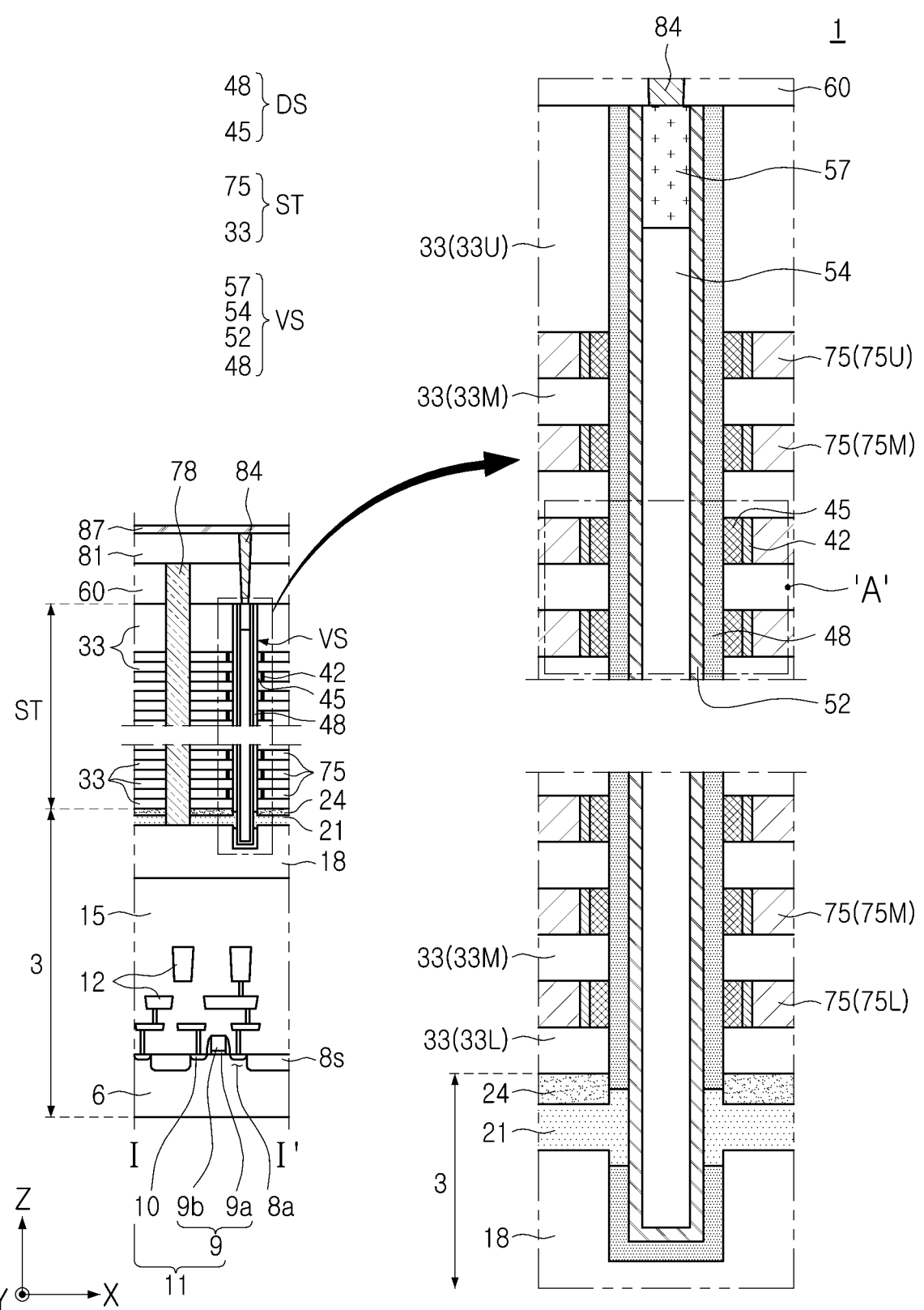
Figure 2B:
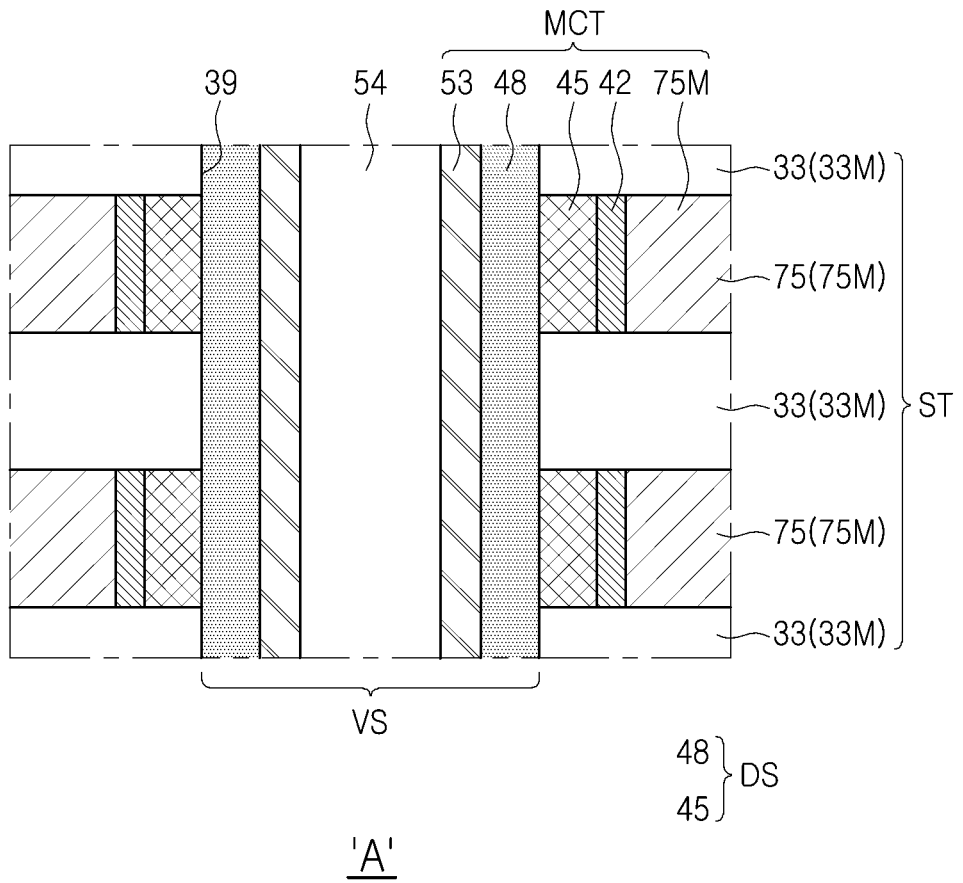

Referring to FIGS. 1, 2A, and 2B, a semiconductor device 1, according to an example embodiment, may include a lower structure 3, a stack structure ST disposed on the lower structure 3, and a vertical structure VS penetrating through the stack structure ST.

The lower structure 3 may include a substrate 6, a device isolation region 8s defining an active region 8a on the substrate 6, a peripheral circuit 11 disposed on the substrate 6, a circuit interconnection structure 12 disposed on the peripheral circuit 11, a peripheral insulating structure 15 covering the peripheral circuit 11 and the circuit interconnection structure 12 disposed on the substrate 6, and a plate layer 18 disposed on the peripheral insulating structure 15.

The substrate 6 may be a semiconductor substrate. For example, the substrate 6 may include a group IV semiconductor, a group III-V compound semiconductor, or a group II-IV compound semiconductor. Alternatively or additionally, the substrate 6 may be a semiconductor substrate including at least one of silicon, silicon carbide, germanium, or silicon-germanium. For example, the substrate 6 may include a silicon material, such as, but not limited to, a single crystal silicon material.

The peripheral circuit 11 may include a transistor including a peripheral gate 9 on the active region 8a and peripheral source/drain regions 10 on both sides of the peripheral gate 9. The peripheral gate 9 may include a peripheral gate dielectric layer 9a and a peripheral gate electrode 9b on the peripheral gate dielectric layer 9a.

The substrate 6, the peripheral circuit 11, the circuit interconnection structure 12, and the peripheral insulating structure 15 may constitute a peripheral circuit structure. Such a peripheral circuit structure may vertically overlap the stack structure ST.

The lower structure 3 may further include a first horizontal pattern 21 disposed on the plate layer 18 and a second horizontal pattern 24 disposed on the first horizontal pattern 21.

The plate layer 18 may include at least one of a doped polysilicon layer and a metal layer (not shown). For example, the plate layer 18 may include a polysilicon layer having an N-type conductivity. The first horizontal pattern 21 may include doped polysilicon, such as, but not limited to, polysilicon having an N-type conductivity. The second horizontal pattern 24 may include doped polysilicon, such as, but not limited to, polysilicon having an N-type conductivity.

The plate layer 18, the first horizontal pattern 21, and the second horizontal pattern 24 may constitute a source structure.

The stack structure ST may include interlayer insulating layers 33 and gate electrodes 75 that are alternately and repeatedly stacked. For example, one of the gate electrodes 75 may be disposed between a first interlayer insulating layer 33 (e.g., 33L) and a second interlayer insulating layer 33 (e.g., 33M) adjacent to each other in a vertical direction Z, among the interlayer insulating layers 33.

The interlayer insulating layers 33 may include a lower interlayer insulating layer 33L, an upper interlayer insulating layer 33U on the lower interlayer insulating layer 33L, and intermediate interlayer insulating layers 33M between the lower interlayer insulating layer 33L and the upper interlayer insulating layer 33U. Among the interlayer insulating layers 33 and the gate electrodes 75, the lowermost layer may be the lower interlayer insulating layer 33L, and the uppermost layer may be the upper interlayer insulating layer 33U. The interlayer insulating layers 33 may be formed of an insulating material, such as, but not limited to, silicon oxide.

The gate electrodes 75 may include one or more lower gate electrodes 75L, one or more upper gate electrodes 75U disposed on the one or more lower gate electrodes 75L, and one or more intermediate gate electrodes 75M disposed between the one or more lower gate electrodes 75L and the one or more upper gate electrodes 75U.

The one or more lower gate electrodes 75L may be lower select gate electrodes, and the one or more upper gate electrodes 75U may be upper select gate electrodes (e.g., string select gate electrodes). The intermediate gate electrodes 75M may be word lines. The gate electrodes 75 may include a conductive material, such as, but not limited to, at least one of doped polysilicon, tungsten (W), ruthenium (Ru), molybdenum (Mo), nickel (Ni), nickel silicide (NiSi), cobalt (Co), cobalt silicide (CoSi), titanium (Ti), tantalum (Ta), titanium nitride (TiN), tantalum nitride (TaN), or tungsten nitride (WN).

The vertical structure VS may be disposed in a hole (or cavity) 39 penetrating through the stack structure ST. The vertical structure VS may include a core pattern 54 in the hole 39, a channel layer 52 disposed on a side surface of the core pattern 54, a data storage layer 48 disposed on an outer surface of the channel layer 52, and a pad pattern 57 disposed on the core pattern 54.

The core pattern 54 may include an insulating material. For example, the core pattern 54 may include, but not be limited to, silicon oxide.

The pad pattern 57 may include doped polysilicon, such as, but not limited to, polysilicon having an N-type conductivity.

The channel layer 52 may be disposed between the core pattern 54 and the stack structure ST. The channel layer 52 may extend from a portion covering the side surface of the core pattern 54 to cover a lower surface of the core pattern 54. For example, in some embodiments, the channel layer 52 may be in contact with the side surface of the core pattern 54 and the lower surface of the core pattern 54. The channel layer 52 may be a semiconductor layer.

For example, the channel layer 52 may include a silicon layer. For example, the channel layer 52 may include, but not be limited to, a single crystal silicon layer or a polysilicon layer.

For another example, the channel layer 52 may include an oxide semiconductor layer or a two-dimensional (2D) material layer having semiconductor properties. For example, the oxide semiconductor layer may be indium gallium zinc oxide (IGZO). However, the example embodiment is not limited thereto. For example, the oxide semiconductor layer may include, but not be limited to, indium tungsten oxide (IWO), indium tin gallium oxide (ITGO), indium aluminum zinc oxide (IAGO), indium gallium oxide (IGO), indium tin zinc oxide (ITZO), zinc tin oxide (ZTO), indium zinc oxide (IZO), zinc oxide (ZnO), indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSn-InZnO), silicon indium zinc oxide (SiInZnO), zinc tin oxide (ZnSnO), aluminum zinc tin oxide (AlZnSnO), gallium zinc tin oxide (GaZnSnO), zirconium zinc tin oxide (ZrZnSnO), and indium gallium silicon oxide (InGaSiO).

The data storage layer 48 may be disposed between the channel layer 52 and the stack structure ST. The data storage layer 48 may include a portion covering an outer surface of the channel layer 52 and a portion covering a lower surface of the channel layer 52. For example, in some embodiments, the data storage layer 48 may include a portion in contact with the outer surface of the channel layer 52 and a portion in contact with the lower surface of the channel layer 52.

The channel layer 52 and the data storage layer 48 may continuously extend from a level lower than the lowest gate electrode among the gate electrodes 75 to a level higher than the highest gate electrode among the gate electrodes 75, in a vertical direction Z.

The vertical structure VS may penetrate through the first horizontal pattern 21 and the second horizontal pattern 24 and extend into the plate layer 18. The vertical structure VS may contact the plate layer 18.

The first horizontal pattern 21 may penetrate through the data storage layer 48 and contact the channel layer 52.

The semiconductor device 1 may further include data storage patterns 45 disposed between the data storage layer 48 and the gate electrodes 75 and dielectric layers 42 disposed between the data storage patterns 45 and the gate electrodes 75.

In a top view on the same level as that of the intermediate gate electrodes 75M, for example, in a top view as illustrated in FIG. 1, the channel layer 52 may have a ring shape surrounding a side surface of the core pattern 54, the data storage layer 48 may have a ring shape surrounding an outer surface of the channel layer 52, the data storage pattern 45 may have a ring shape surrounding an outer surface of the data storage layer 48, and the dielectric layer 42 may have a ring shape surrounding an outer surface of the data storage pattern 45.

The data storage patterns 45 and the dielectric layers 42 may be disposed between the data storage layer 48 and the gate electrodes 75, and may be disposed between the interlayer insulating layers 33. The data storage patterns 45 may be disposed between the interlayer insulating layers 33 to vertically overlap the interlayer insulating layers 33.

The data storage patterns 45 may be stacked while being spaced apart from each other in the vertical direction Z along a side surface of the vertical structure VS. The data storage patterns 45 may be spaced apart from each other in the vertical direction Z.

The dielectric layer 42 may include silicon oxide and/or silicon oxide doped with impurities, but the example embodiment is not limited thereto. For example, the dielectric layer 42 may include a high-κdielectric material having a dielectric constant higher than that of silicon oxide. In some embodiments, the dielectric layer 42 may include at least one of silicon oxide and a high-κdielectric material.

The semiconductor device 1 may further include a first upper insulating layer 60 and a second upper insulating layer 81 sequentially stacked on the stack structure ST and the vertical structure VS.

The semiconductor device 1 may further include a separation structure 78 penetrating through the first upper insulating layer and the stack structure ST and contacting the lower structure 3. The separation structure 78 may penetrate through the first horizontal pattern 21 and the second horizontal pattern 24 and may contact the plate layer 18. For example, the separation structure 78 may be formed of an insulating material, such as, but not limited to, silicon oxide. For another example, the separation structure 78 may include a conductive separation pattern and an insulating separation spacer covering a side surface of the separation pattern.

The semiconductor device 1 may further include a contact plug 84 penetrating through the first upper insulating layer 60 and the second upper insulating layer 81 and be electrically connected (e.g., coupled) to the vertical structure VS. Alternatively or additionally, the semiconductor device 1 may further include a bit line 87 that may be electrically connected (e.g., coupled) to the contact plug 84 on the second upper insulating layer 81.

The gate electrodes 75 may be stacked, while being spaced apart from each other in the vertical direction Z, perpendicular to an upper surface of the lower structure 3. The gate electrodes 75 may extend in the first direction Y, and the bit line 87 may extend in a second direction X, perpendicular to the first direction Y. The first and second directions Y and X may be parallel to an upper surface of the lower structure 3.

In an example embodiment, the semiconductor device 1 may store information using the data storage layer 48 and the data storage patterns 45. Accordingly, the data storage layer 48 and the data storage patterns 45 may constitute the data storage structure DS.

A material of the data storage layer 48 and a material of the data storage patterns 45 may be different from each other.

In an example embodiment, the data storage layer 48 may be a ferroelectric layer. For example, the data storage layer 48, which may be a ferroelectric layer, may have polarization characteristics according to an electric field, and may have residual polarization due to dipoles even in the absence of an external electric field. Data may be recorded using a polarization state in the ferroelectric layer. Regions of the data storage layer 48 facing the intermediate gate electrodes 75M, which may be word lines, may be regions for storing information using a polarization state.

The ferroelectric layer of the data storage layer 48 may include a hafnium (Hf)-based compound, a zirconium (Zr)-based compound, and/or an Hf—Zr-based compound. For example, the Hf-based compound may be a hafnium oxide (HfO)-based ferroelectric material, the Zr-based compound may include a zirconium oxide (ZrO)-based ferroelectric material, and the Hf—Zr-based compound may include a hafnium zirconium oxide (HZO)-based ferroelectric material.

The ferroelectric layer of the data storage layer 48 may include a ferroelectric material doped with impurities among, for example but not limited to, at least one of carbon (C), silicon (Si), magnesium (Mg), aluminum (Al), yttrium (Y), nitrogen (N), germanium (Ge), tin (Sn), gadolinium (Gd), lanthanum (La), scandium (Sc), or strontium (Sr). For example, the ferroelectric layer of the data storage layer 48 may be a material obtained by doping at least one of impurities C, Si, Mg, Al, Y, N, Ge, Sn, Gd, La, Sc, or Sr in at least one of $HfO_2$, $ZrO_2$, and HZO.

The ferroelectric layer of the data storage layer 48 is not limited to the material types described above, and may include a material having ferroelectric properties capable of storing information. For example, the ferroelectric layer of the data storage layer 48 may include, but not be limited to, at least one of $BaTiO_3$, $PbTiO_3$, $BiFeO_3$, $SrTiO_3$, $PbMgNdO_3$, $PbMgNbTiO_3$, $PbZrNbTiO_3$, $PbZrTiO_3$, $KNbO_3$, $LiNbO_3$, GeTe, $LiTaO_3$, $KNaNbO_3$, $BaSrTiO_3$, $HF_{0.5}Zr_{0.5}O_2$, $PbZr_xTi1-xO3$ (where $0<x<1$), $Ba(Sr, Ti)O_3$, $Bi_{4-x}La_xTi3O12$ (where $0<x<1$), $SrBi_2Ta_2O_9$, $Pb_5Ge_5O_{11}$, $SrBi_2Nb_2O_9$, or $YMnO_3$.

In an example embodiment, the data storage patterns 45 may be patterns capable of storing data using charge injection or a charge trap. The data storage patterns 45 may include a conductive material and/or a charge trap material.

For example, the data storage patterns 45 may be floated conductive patterns capable of storing data by charge injection. For example, the data storage patterns 45 may include doped polysilicon or metal (e.g., W, Mo, etc.). The data storage patterns 45 may be referred to as a floating gate, a floating metal, and/or a floating conductive pattern.

For another example, the data storage patterns 45 may comprise charge trap flash (CTF) patterns configured to store information by trapping a charge. For example, the data storage patterns 45 may include a material capable of trapping a charge, for example, but not limited to, silicon nitride.

Any one of the memory cell transistors MCT of the semiconductor device 1 may include one word line 75M, the channel layer 53, and the data storage layer 48, the data storage pattern 45, and the dielectric layer 42 disposed between the word line 75M and the channel layer 53.

In the memory cell transistor MCT, the dielectric layer 42 may be a tunnel gate insulating layer or a tunnel gate dielectric layer.

During an operation of the memory cell transistor MCT, an electric field between the word line 75M and the data storage pattern 45 may be greater than an electric field between the data storage pattern 45 and the channel layer 53. In this manner, in order to make the electric field between the word line 75M and the data storage pattern 45 greater than the electric field between the data storage pattern 45 and the channel layer 53 during the operation of the memory cell transistor MCT, a thickness of the data storage layer 48 may be greater than a thickness of the dielectric layer 42 and a thickness of the data storage pattern 45 may be greater than a thickness of the dielectric layer 42. That is, the thickness of the data storage pattern 45 may be a distance, in the X direction, between both sides of the data storage pattern 45.

In some embodiments, the thickness of the dielectric layer 42 may be in a range from about (e.g., approximately) 10 angstrom (Å) to about 50 Å. Alternatively or additionally, the thickness of the data storage layer 48 may be in a range from about 50 Å to about 150 Å and the thickness of the data storage pattern 45 may be in a range from about 50 Å to about 150 Å. When the thickness of the dielectric layer 42 is in the range from about 10 Å to about 50 Å, the thickness of the data storage layer 48 may be in a range from about 50 Å to about 150 Å, and the thickness of the data storage pattern 45 may be in a range from about 50 Å to about 150 Å. As a result, a memory window of the semiconductor device 1 may be increased, endurance and retention characteristics of the semiconductor device 1 may be improved, and an operating voltage of the semiconductor device 1 may be lowered, when compared to related semiconductor devices.

An operating method of the semiconductor device 1 including the memory cell transistor MCT is described below.

In the memory cell transistor MCT, a write operation may include applying a program voltage greater than 0 V to the word line 75M and grounding the bit line 87 and the channel layer 53 to lower a threshold voltage of the memory cell transistor MCT.

In the program operation, a program voltage of about 20 V or more may be applied to the word line 75M and keeping the bit line BL and the channel layer 53 grounded, so that electrons in the data storage pattern 45 may be injected into the word line 75M through the dielectric layer 42. At the same time, a first polarization state, in which positive charges are aligned to be adjacent to the channel layer 53 and negative charges are aligned to be adjacent to the data storage pattern 45 in the data storage layer 48, may be formed of a ferroelectric layer. By the program operation, the data storage structure DS, including the data storage pattern 45 and the data storage layer 48, may be in a programmed state.

By the program operation, the electrons in the data storage pattern 45 may be ejected to the word line 75M, so that a threshold voltage of the memory cell transistor MCT may be lowered primarily. Alternatively or additionally, as the first polarization state is formed, the threshold voltage of the memory cell transistor MCT may be lowered secondarily. Accordingly, by the program operation, the threshold voltage of the memory cell transistor MCT may be lowered by the data storage pattern 45 and the data storage layer 48.

In the memory cell transistor MCT, an erase operation may include grounding the word line 75M and applying an erase voltage to the channel layer 53 through the bit line BL and the source structures (e.g., the plate layer 18, the first horizontal pattern 21, and the second horizontal pattern 24) to increase the threshold voltage of the memory cell transistor MCT. For example, by grounding the word line 75M and applying an erase voltage of about 15 V or higher to the channel layer 53, electrons may be injected from the word line 75M into the data storage pattern 45 and, at the same time, in the data storage layer 48, which may be formed of a ferroelectric layer, a second polarization state may be formed. In the second polarization state, positive charges may be aligned to be adjacent to the data storage pattern 45 and negative charges may be aligned to be adjacent to the channel layer 53. Here, in the programmed state, the data storage layer 48 may be in the first polarization state, and as a polarization direction of the data storage layer 48 is switched from the first polarization state by the erase operation, the data storage layer 48 may be in the second polarization state. That is, the polarization direction of the data storage layer 48 may be switched by the write operation and/or the erase operation. By the erase operation, the data storage structure DS including the data storage pattern 45 and the data storage layer 48 may be in an erase state.

In the erase operation, electrons may be injected from the data storage pattern 45 into the word line 75M, so that a threshold voltage of the memory cell transistor MCT may be increased primarily, and, as the second polarization state is formed, a threshold voltage of the memory cell transistor MCT may be increased secondarily. Accordingly, by the erase operation, the threshold voltage of the memory cell transistor MCT may be increased by the data storage pattern 45 and the data storage layer 48.

As described above, the data storage pattern 45 and the data storage layer 48 may store information in different manners. In the memory cell transistor MCT, including two data storage patterns 45 and the data storage layer 48 as described above, a difference between the threshold voltage of the memory cell transistor MCT in the programmed state and the threshold voltage of the memory cell transistor MCT in the erased state may be significant. As the difference between the threshold voltages of the programmed state and the erased state is significant as described above, a memory window may be increased when compared to related semiconductor devices.

As described above, since the data storage structure DS may include the data storage patterns 45 capable of storing information using charge injection or a charge trap and the data storage layer 48 capable of storing information using the polarization state, the memory window of the semiconductor device 1 may be increased, endurance and retention of the semiconductor device 1 may be improved, and the operating voltage of the semiconductor device 1 may be lowered, when compared to related semiconductor devices. Alternatively or additionally, in the semiconductor device 1, since the memory window may be increased, a multibit operation may be ensured.

Hereinafter, various modified examples of the elements of the example embodiment described above are described below. Various modified examples of the elements of the example embodiment described above to be described below are to be mainly described with respect to modified elements and/or replaced elements. In addition, the elements that may be modified and/or replaced described below may be described with reference to the accompanying drawings, but the elements that may be modified and/or replaced may be combined with each other and/or may be combined with the elements described above to configure a semiconductor device, according to an example embodiment of the present disclosure.

Figure 3:
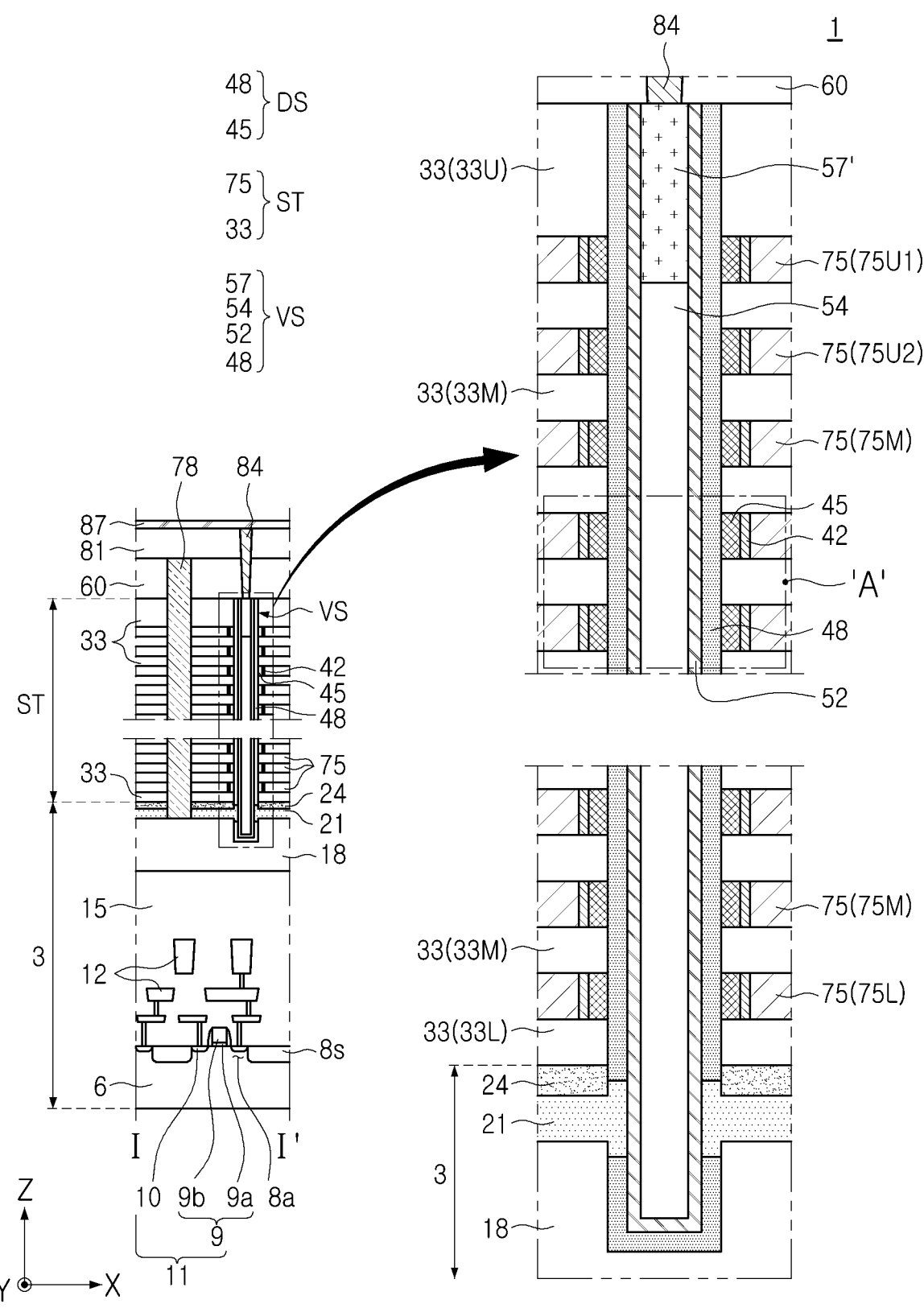
FIG. 3 is a cross-sectional view schematically illustrating a modified example of a semiconductor device, according to an example embodiment of the present disclosure.

A modified example of a semiconductor device, according to an example embodiment of the present disclosure, is described with reference to FIG. 3. FIG. 3 is a cross-sectional view schematically illustrating a region taken along line I-I' of FIG. 1.

In a modified example, referring to FIG. 3, one or more upper gate electrodes (e.g., the one or more upper gate electrodes 75U in FIG. 2A) described above with reference to FIG. 2A may be replaced with a plurality of upper gate electrodes 75U1 and 75U2 spaced apart from each other in a vertical direction (e.g., direction Z). For example, the plurality of upper gate electrodes 75U1 and 75U2 may include one or more first upper gate electrodes 75U1 and one or more second upper gate electrode 75U2 disposed below the one or more first upper gate electrodes 75U1.

For example, the one or more first upper gate electrodes 75U1 may be erase control gate electrodes that may generate a gate induced drain leakage (GIDL) current based on a GIDL phenomenon in a NAND flash memory device to be used for an erase operation, and the one or more second upper gate electrodes 75U2 may be string select gate electrodes.

The pad pattern (e.g., pad pattern 57 in FIG. 2A), which may be disposed on a level higher than that of the one or more upper gate electrodes (e.g., the one or more upper gate electrodes 75U in FIG. 2A) described above with reference to FIG. 2A, may be replaced with a pad pattern 57' horizontally overlapping at least some of the one or more first upper gate electrodes 75U1 in order to increase the efficiency of generating GIDL current based on the GIDL phenomenon.

An upper surface of the pad pattern 57' may be disposed on a level higher than that of the one or more first upper gate electrodes 75U1, a lower surface of the pad pattern 57' may be disposed on a level higher than that of the one or more second upper gate electrodes 75U2, and a portion of the pad pattern 57' may be disposed on the same level as that of at least some of the one or more first upper gate electrodes 75U1.

Various modifications of a semiconductor device, according to an example embodiment of the present disclosure, are described with reference to FIGS. 4A to 4E, respectively. FIGS. 4A to 4E are partially enlarged views schematically illustrating modified elements in a partially enlarged cross-sectional view of FIG. 2B.

Figure 4A:
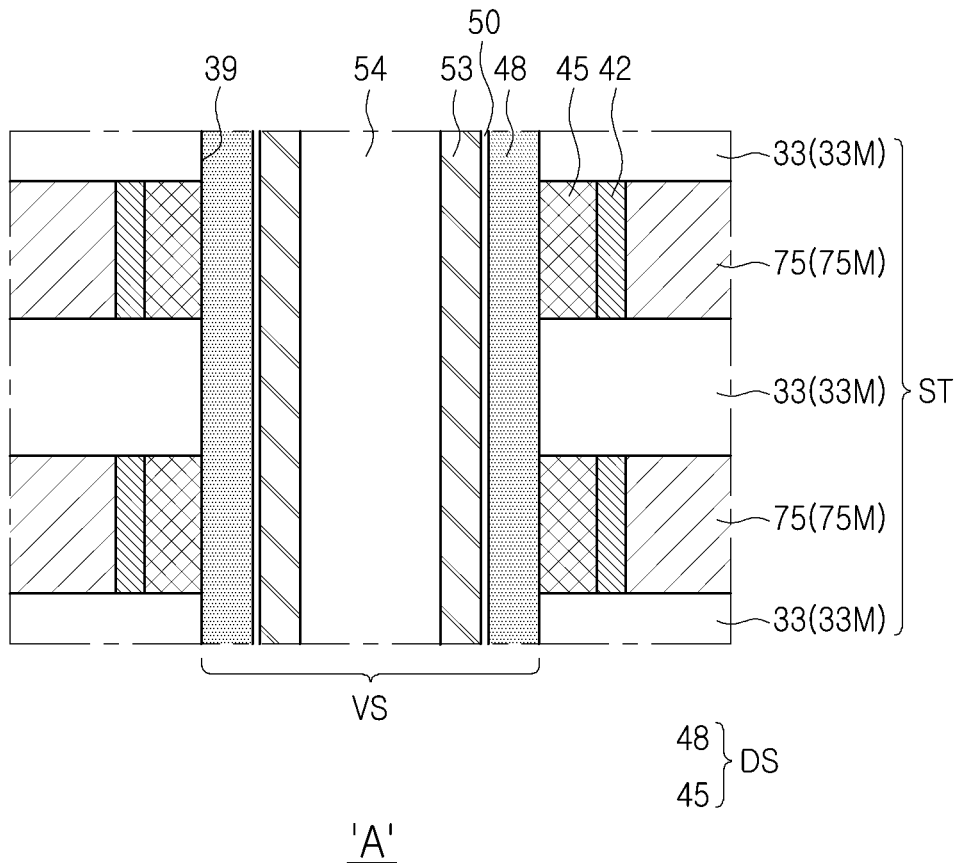
FIG. 4A is a partially enlarged cross-sectional view schematically illustrating a modified example of a semiconductor device, according to an example embodiment of the present disclosure.

In a modified example, referring to FIG. 4A, the vertical structure VS may further include a buffer layer 50 between the data storage layer 48 and the channel layer 53. In some embodiments, the buffer layer 50 may be formed of an oxide. For example, the buffer layer 50 may include, but not be limited to, at least one of silicon oxide, silicon oxynitride, silicon nitride, and a high-κdielectric material. The high-κdielectric material may include, but not be limited to, a metal oxide or a metal oxynitride. For example, the high dielectric material may be formed of $HfO_2$, HfSiO, HfSiON, HfTaO, HfTiO, HfZrO, $ZrO_2$, $Al_2O_3$, or combinations thereof, but is not limited thereto.

Figure 4B:
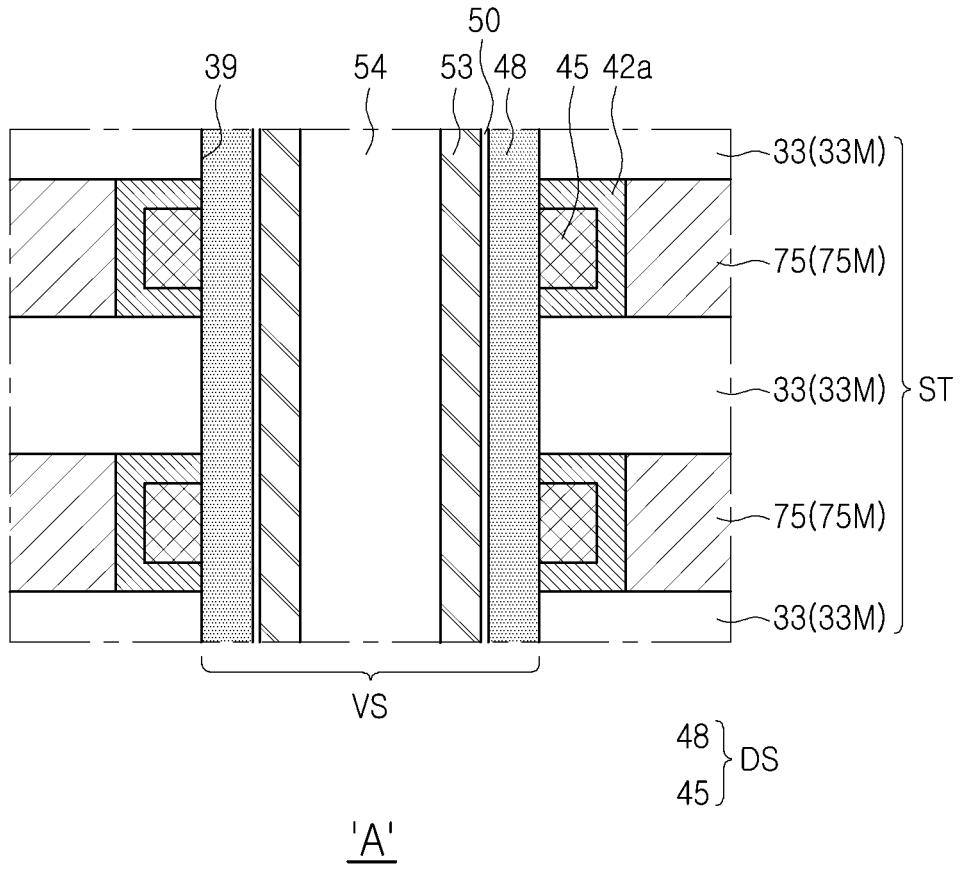
FIG. 4B is a partially enlarged cross-sectional view schematically illustrating a modified example of a semiconductor device, according to an example embodiment of the present disclosure.

In a modified example, referring to FIG. 4B, the aforementioned dielectric layer (e.g., the dielectric layer 42 in FIG. 4A) may be replaced with a dielectric layer 42a extending from a portion disposed between the gate electrode 75 and the data storage pattern 45 to cover the upper and lower surfaces of the data storage pattern 45. The dielectric layer 42a may include a portion disposed between the gate electrode 75 and the data storage pattern 45, and portions disposed between the interlayer insulating layers 33 and the data storage pattern 45.

Figure 4C:
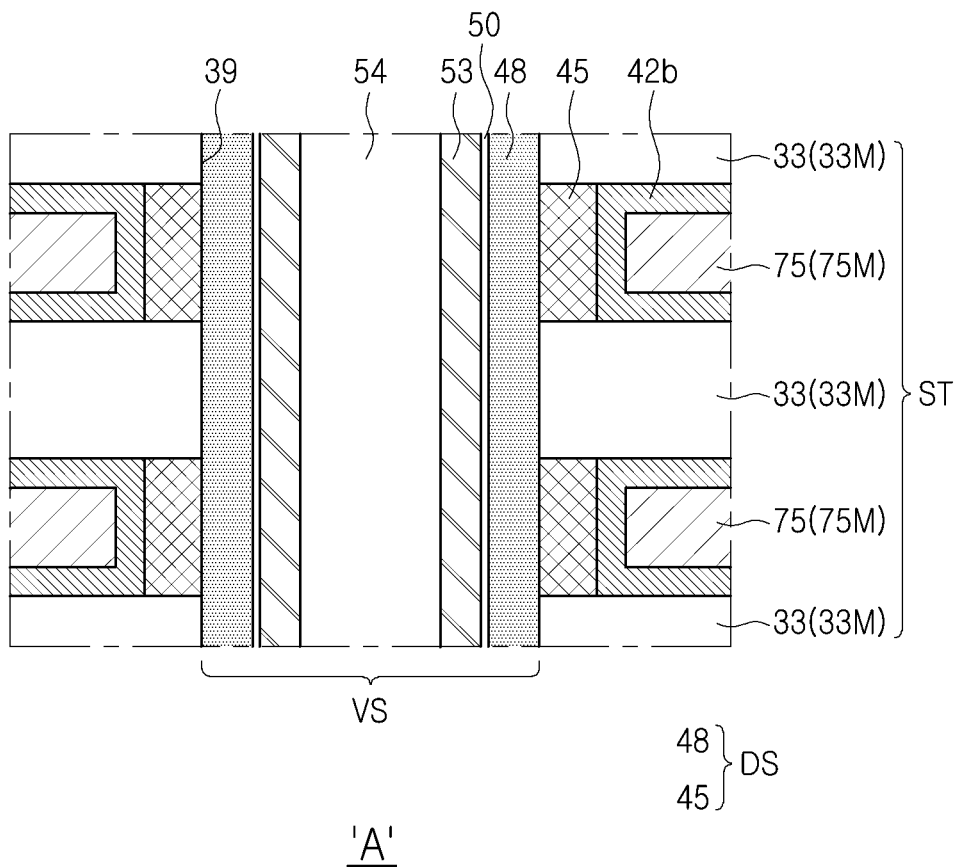
FIG. 4C is a partially enlarged cross-sectional view schematically illustrating a modified example of a semiconductor device, according to an example embodiment of the present disclosure.

In a modified example, referring to FIG. 4C, the dielectric layer described above (e.g., the dielectric layer 42 in FIG. 4A) may be replaced with a dielectric layer 42b extending from a portion disposed between the gate electrode 75 and the data storage pattern 45 to cover the upper and lower surfaces of the gate electrode 75. The dielectric layer 42b may include a portion disposed between the gate electrode 75 and the data storage pattern 45 and portions disposed between the interlayer insulating layers 33 and the gate electrode 75.

Figure 4D:
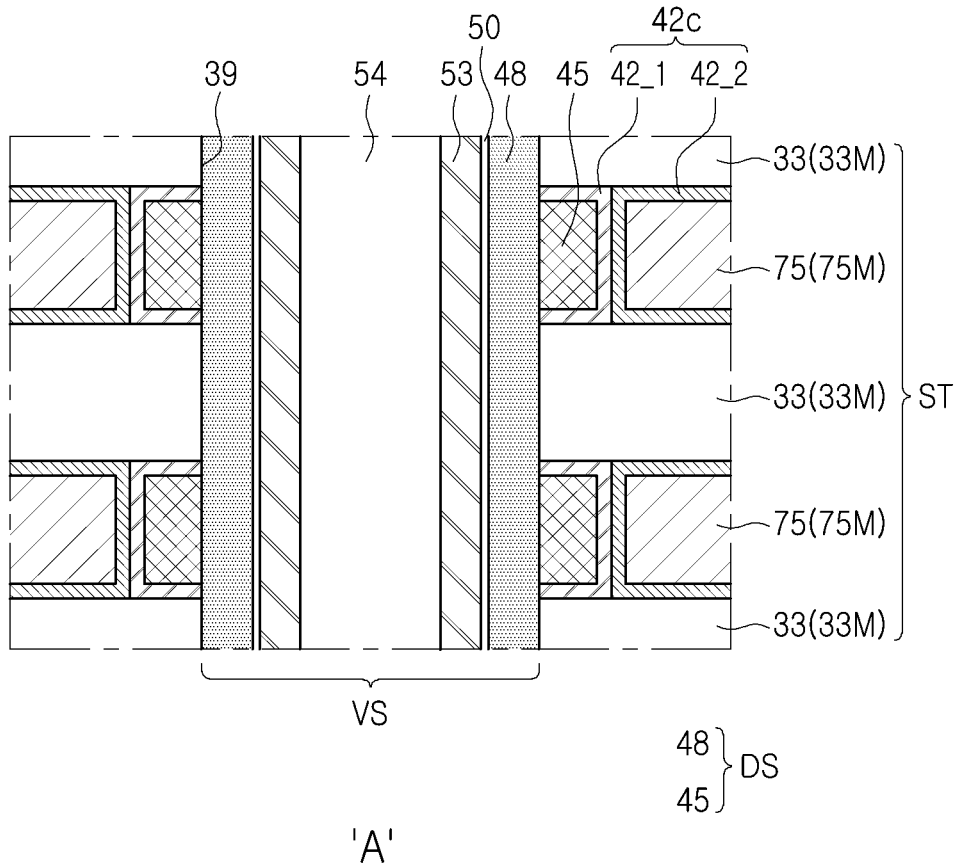
FIG. 4D is a partially enlarged cross-sectional view schematically illustrating a modified example of a semiconductor device, according to an example embodiment of the present disclosure.

In a modified example, referring to FIG. 4D, the dielectric layer described above (e.g., the dielectric layer 42 in FIG. 4A) may be replaced with a dielectric layer 42c including a first dielectric layer 42_1 and a second dielectric layer 42_2.

The first dielectric layer 42_1 may extend from a portion disposed between the gate electrode 75 and the data storage pattern 45 to cover the upper and lower surfaces of the data storage pattern 45. The first dielectric layer 42_1 may include a portion disposed between the gate electrode 75 and the data storage pattern 45 and a portion disposed between the interlayer insulating layers 33 and the data storage pattern 45.

The second dielectric layer 42_2 may extend from a portion disposed between the gate electrode 75 and the first dielectric layer 42_1 to cover upper and lower surfaces of the gate electrode 75. The second dielectric layer 42_2 may include a portion disposed between the gate electrode 75 and the first dielectric layer 42_1 and a portion disposed between the interlayer insulating layers 33 and the gate electrode 75.

Figure 4E:
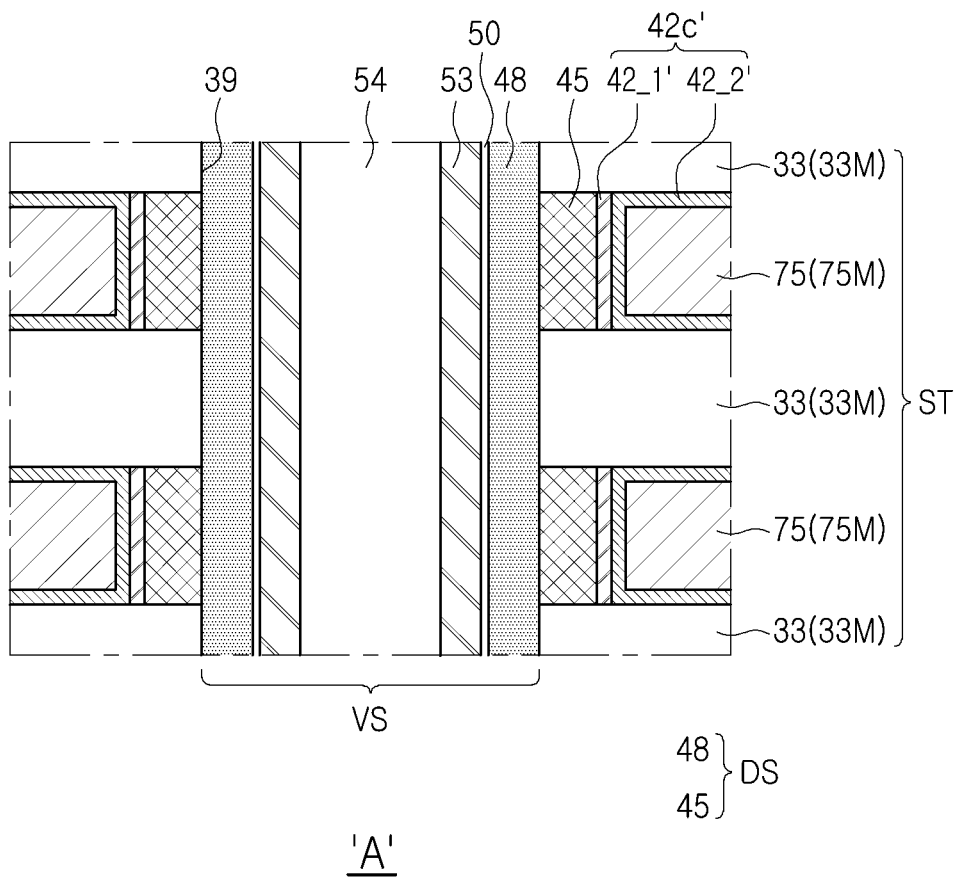
FIG. 4E is a partially enlarged cross-sectional view schematically illustrating a modified example of a semiconductor device, according to an example embodiment of the present disclosure.

In a modified example, referring to FIG. 4E, the dielectric layer described above (e.g., the dielectric layer 42 in FIG. 4A) may be replaced with a dielectric layer 42c' including a first dielectric layer 42_1' and a second dielectric layer 42_2'.

The first dielectric layer 42_1' may be disposed between the gate electrode 75 and the data storage pattern 45 and may not cover upper and lower surfaces of the data storage pattern 45.

The second dielectric layer 42_2' may extend from a portion disposed between the gate electrode 75 and the first dielectric layer 42_1' to cover the upper and lower surfaces of the gate electrode 75. The second dielectric layer 42_2' may include a portion disposed between the gate electrode 75 and the first dielectric layer 42_1' and portions disposed between the interlayer insulating layers 33 and the gate electrode 75.

Figure 5:
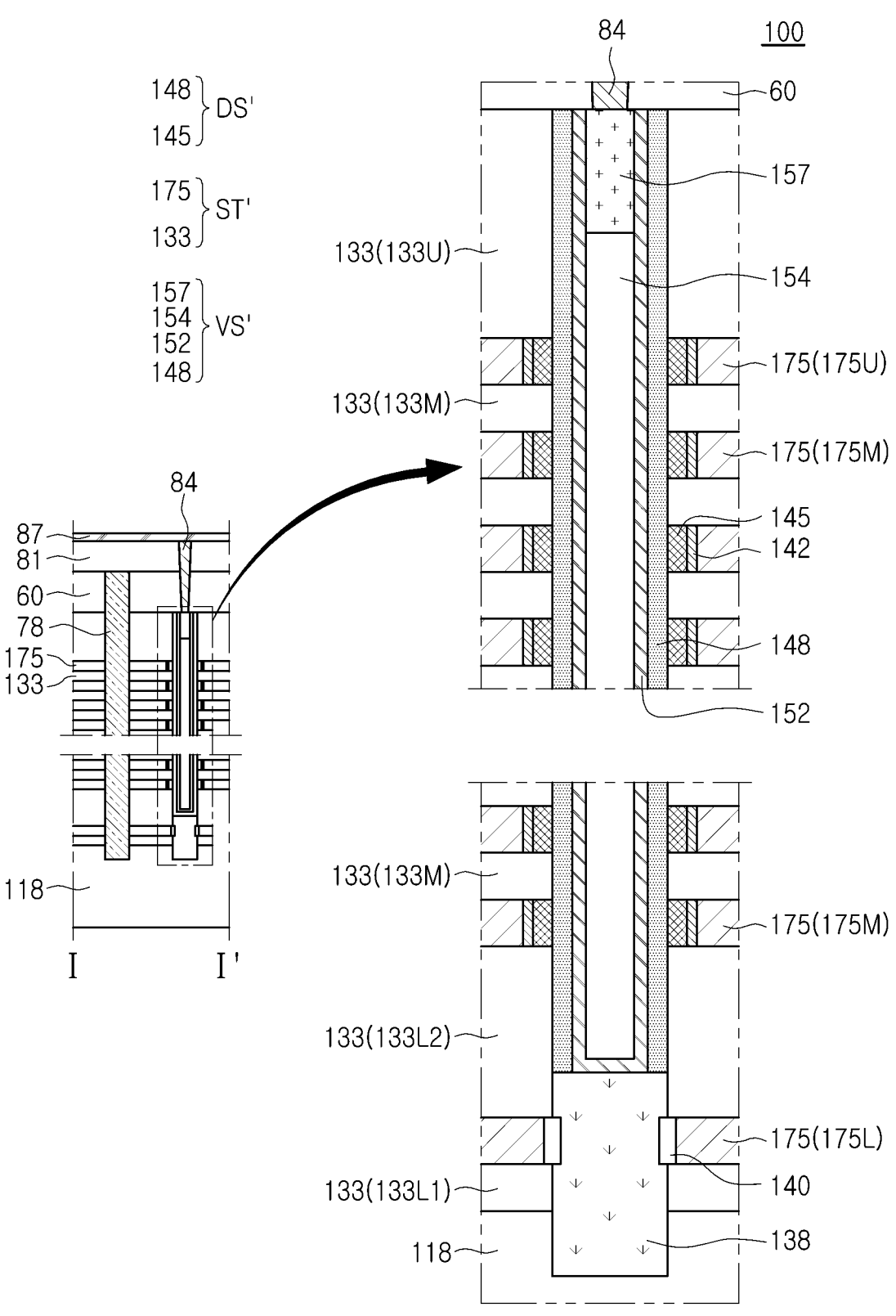
FIG. 5 is a cross-sectional view schematically illustrating a modified example of a semiconductor device, according to an example embodiment of the present disclosure.

FIG. 5 is a cross-sectional view illustrating a modified example of a cross-sectional structure of a region taken along line I-I' of FIG. 1 in order to explain a modified example of a semiconductor device, according to an example embodiment of the present disclosure.

In a modified example, referring to FIG. 5, a semiconductor device 100 in the modified example may include a substrate 118, a stack structure ST' disposed on the substrate 118, and a vertical structure penetrating through the stack structure ST'. The substrate 118 may include silicon. For example, the substrate 118 may include, but not be limited to, at least one of a single crystal silicon substrate and a polysilicon substrate.

The semiconductor device 100 depicted in FIG. 5 may include or may be similar in many respects to the semiconductor device 1 described above with reference to FIGS. 1 to 4E and may include additional features not mentioned above.

The stack structure ST' may include alternately stacked interlayer insulating layers 133 and gate electrodes 175.

The interlayer insulating layers 133 may include a first lower interlayer insulating layer 133L1, a second lower interlayer insulating layer 133L2 disposed on the first lower interlayer insulating layer 133L1, intermediate lower interlayer insulating layers 133M disposed on the second lower interlayer insulating layer 133L2, and an upper interlayer insulating layer 133U disposed on the intermediate lower interlayer insulating layers 133M.

Among the interlayer insulating layers 133 and the gate electrodes 175, the lowermost layer may be the first lower interlayer insulating layer 133L1, and the uppermost layer may be the upper interlayer insulating layer 133U.

The gate electrodes 175 may include a lower gate electrode 175L, one or more upper gate electrodes 175U disposed on the lower gate electrode 175L, and intermediate gate electrodes 175M disposed between the lower gate electrode 175L and the one or more upper gate electrodes 175U. The lower gate electrode 175L may be a lower select gate electrode, and the one or more upper gate electrodes 175U may be upper select gate electrodes (e.g., string select gate electrodes). The intermediate gate electrodes 175M may be word lines.

The vertical structure VS' may be disposed in a hole (e.g., hole 39 of FIG. 2B) penetrating through the stack structure ST'. The vertical structure VS' may include a lower channel layer 138, a core pattern 154 disposed on the lower channel layer 138, an upper channel layer 152 covering side surfaces and lower surfaces of the core pattern 154, a data storage layer 148 covering an outer surface of the upper channel layer 152, and a pad pattern 157 on the core pattern 154. For example, in some embodiments, the upper channel layer 152 may be in contact with the side surfaces and the lower surfaces of the core pattern 154. Alternatively or additionally, the data storage layer 148 may be in contact with the outer surface of the upper channel layer 152.

The lower channel layer 138 extends upwardly from a portion in contact with the substrate 118, penetrating through the first lower interlayer insulating layer 133L1 and the lower gate electrode 75L, into the insulating layer 133L2. The lower channel layer 138 may be an epitaxial silicon layer, for example.

The core pattern 154 may be disposed on the lower channel layer 138. The core pattern 154 may include an insulating material. The pad pattern 157 may be disposed on the core pattern 154. The pad pattern 157 may include doped polysilicon, for example, but not limited to, polysilicon having an N-type conductivity.

The upper channel layer 152 may be disposed between the core pattern 154 and the stack structure ST'. The upper channel layer 152 may extend between the core pattern 154 and the lower channel layer 138 from a portion covering a side surface of the core pattern 154.

The data storage layer 148 may be disposed between the upper channel layer 152 and the stack structure ST'. The data storage layer 148 may cover an outer surface of the upper channel layer 152.

The upper channel layer 152 and the data storage layer 148 may be disposed higher than the lower gate electrode 175L and may continuously extend from a level lower than the lowermost intermediate gate electrode, among the intermediate gate electrodes 175M, to a level higher than the uppermost gate electrode, in the vertical direction Z, among the gate electrodes 175.

The vertical structure VS' may further include a gate insulating layer 140 disposed between the lower channel layer 138 and the lower gate electrode 175L. The gate insulating layer 140 may be formed of an insulating material, such as, but not limited to, silicon oxide.

The semiconductor device 100 may further include data storage patterns 145 disposed between the data storage layer 148 and the intermediate gate electrodes 175M and the upper gate electrodes 175U, and dielectric layers 142 disposed between the data storage patterns 145 and the intermediate gate electrodes 175M and the upper gate electrodes 175U. The dielectric layers 142, the data storage patterns

145, the data storage layer 148, the upper channel layer 152, and the gate electrodes 175 may be formed of the same material as that of the dielectric layers 42, the data storage patterns 45, the data storage layer 48, the channel layer 52, and the gate electrodes 75 described above with reference to FIGS. 1 to 2B.

As described above with reference to FIGS. 1 to 2B, the dielectric layers 42, the data storage patterns 45, the data storage layer 48, the channel layer 52, and the intermediate gate electrodes 75M may constitute the memory cell transistors MCT. Similarly, the dielectric layers 142, the data storage patterns 145, the data storage layer 148, the upper channel layer 152, and the intermediate gate electrodes 175M of FIG. 5 may constitute memory cell transistors MCT.

As described above with reference to FIGS. 1 to 2B, the semiconductor device 100 may include a first upper insulating layer 60 and a second upper insulating layer 81 sequentially stacked on the stack structure ST' and the vertical structure VS', the separation structure 78 penetrating through the first upper insulating layer and the stack structure ST and contacting the lower structure 3, a contact plug 84 penetrating through the first and second upper insulating layers 60 and 81 and electrically connected to the vertical structure VS, and a bit line 87 electrically connected to the contact plug 84 on the second upper insulating layer 81.

Figure 6:
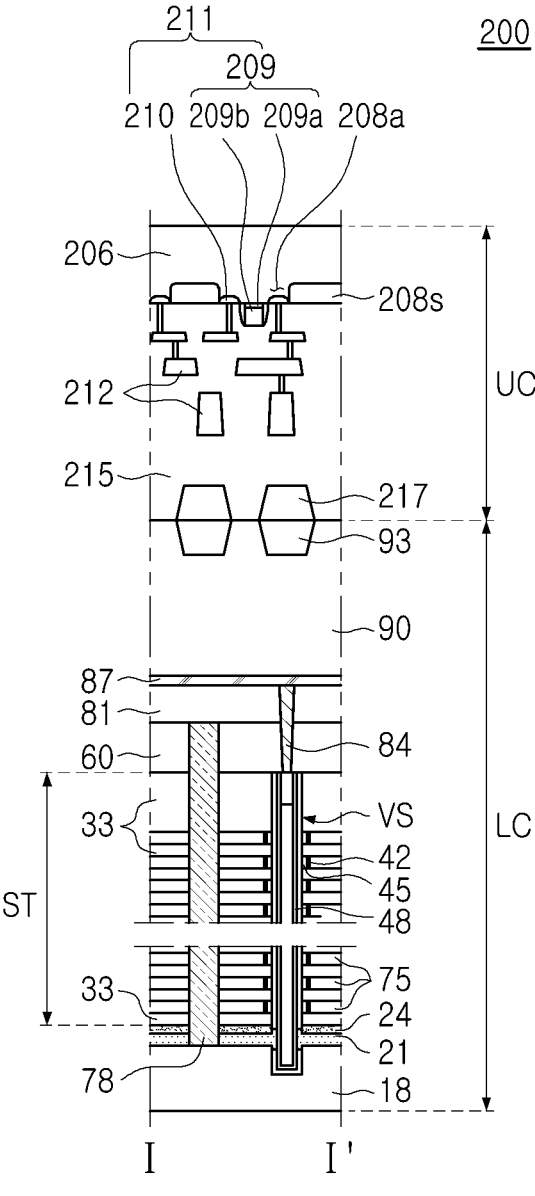
FIG. 6 is a cross-sectional view schematically illustrating a modified example of a semiconductor device, according to an example embodiment of the present disclosure.

FIG. 6 is a cross-sectional view illustrating a modified example of a cross-sectional structure of a region taken along line I-I' of FIG. 1 in order to explain a modified example of a semiconductor device, according to an example embodiment of the present disclosure.

In a modified example, referring to FIG. 6, a semiconductor device 200 in the modified example may include a lower semiconductor chip LC and an upper semiconductor chip UC bonded to the lower semiconductor chip LC on the lower semiconductor chip LC.

The semiconductor device 200 depicted in FIG. 6 may include or may be similar in many respects to the semiconductor device 100 of FIG. 5 and the semiconductor device 1 described above with reference to FIGS. 1 to 4E, and may include additional features not mentioned above.

The lower semiconductor chip LC may include the source structures (e.g., the plate layer 18, the first horizontal pattern 21, and the second horizontal pattern 24), the stack structure ST, the vertical structure VS, the data storage patterns 45, the dielectric layers 42, the first upper insulating layer 60, the second upper insulating layer 81, the separation structure 78, the contact plug 84, and the bit line 87, as illustrated in FIGS. 2A and 2B.

The lower semiconductor chip LC may further include an insulating structure 90 disposed on the second upper insulating layer 81 and the bit line 87. Alternatively or additionally, the lower semiconductor chip LC may further include a lower bonding pad 93 surrounded by the insulating structure 90 and having an upper surface coplanar with an upper surface of the insulating structure 90.

The upper semiconductor chip UC may further include a substrate 206, a device isolation region 208s defining an active region 208a disposed below the substrate 206, a peripheral circuit 211 disposed below the substrate 206, a circuit interconnection structure 212 disposed below the peripheral circuit 211, a peripheral insulating structure 215 covering the peripheral circuit 211 and the circuit interconnection structure 212 and being disposed below the substrate 206, and an upper bonding pad 217 having a side surface surrounded by the peripheral insulating structure 215 and having a lower surface coplanar with a lower surface of the peripheral insulating structure 215.

The peripheral circuit 211 may include a transistor including a peripheral gate 209 disposed below the active region 208a and peripheral source/drain regions 210 disposed on both sides of the peripheral gate 209. The peripheral gate 209 may include a peripheral gate dielectric layer 209a and a peripheral gate electrode 209b disposed on the peripheral gate dielectric layer 209a.

The substrate 206, the peripheral circuit 211, the circuit interconnection structure 212, and the peripheral insulating structure 215 may constitute a peripheral circuit structure. Such a peripheral circuit structure may overlap the stack structure ST vertically.

The lower bonding pad 93 and the upper bonding pad 217 may include a metal material and/or may be bonded. For example, the lower bonding pad 93 and/or the upper bonding pad 217 may include copper (Cu), and the copper of the lower bonding pad 93 and the copper of the upper bonding pad 217 may be bonded to be in contact with each other.

A method of forming a semiconductor device, according to an example embodiment of the present disclosure, is described with reference to FIGS. 7A to 7D.

Figure 7A:
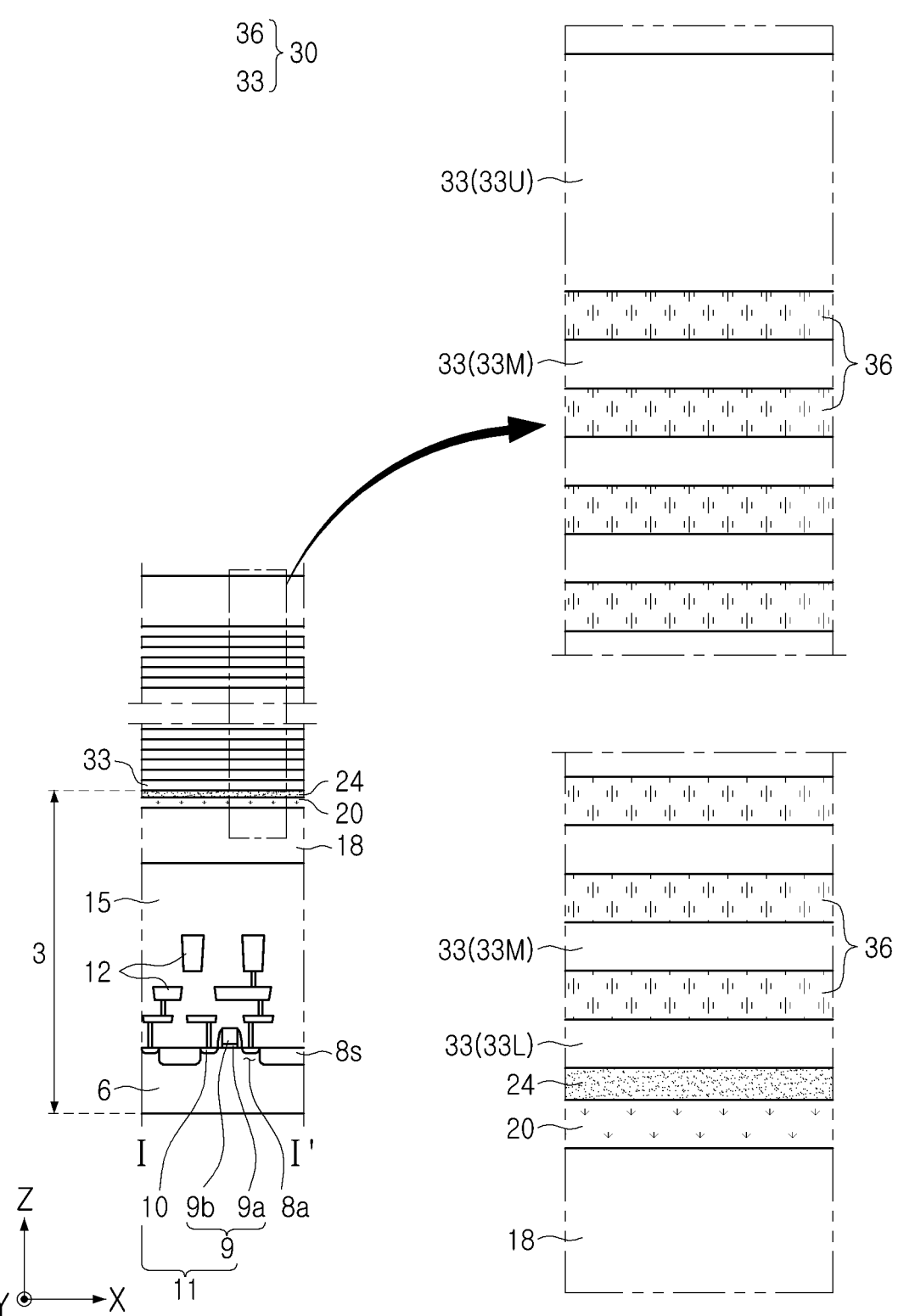
FIGS. 7A to 7D are cross-sectional views schematically illustrating an example of a method of forming a semiconductor device, according to an example embodiment of the present disclosure.
Figure 7B:
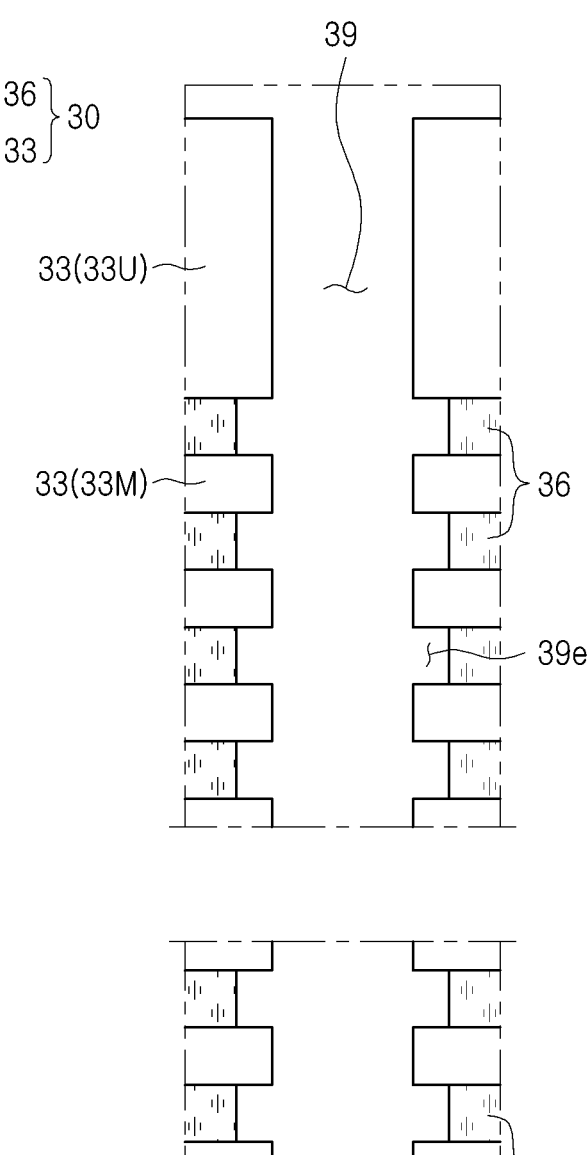
Figure 7C:
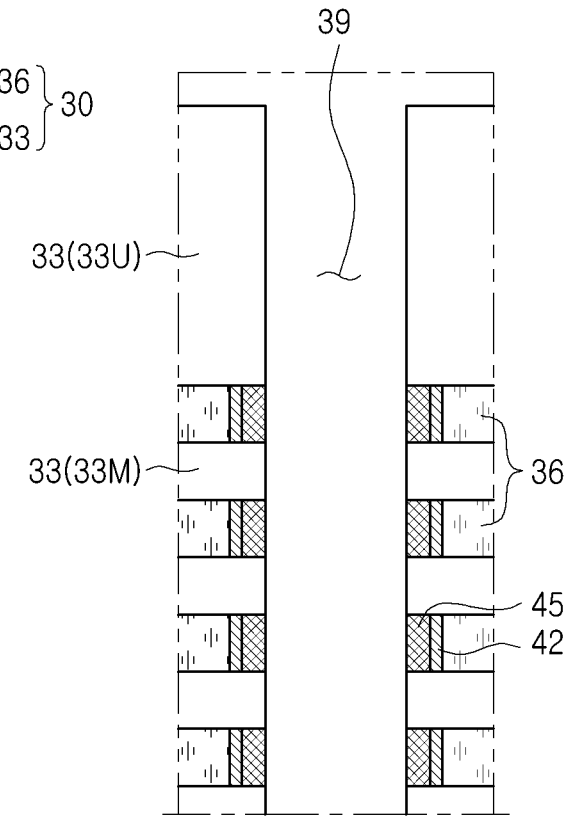
Figure 7C:
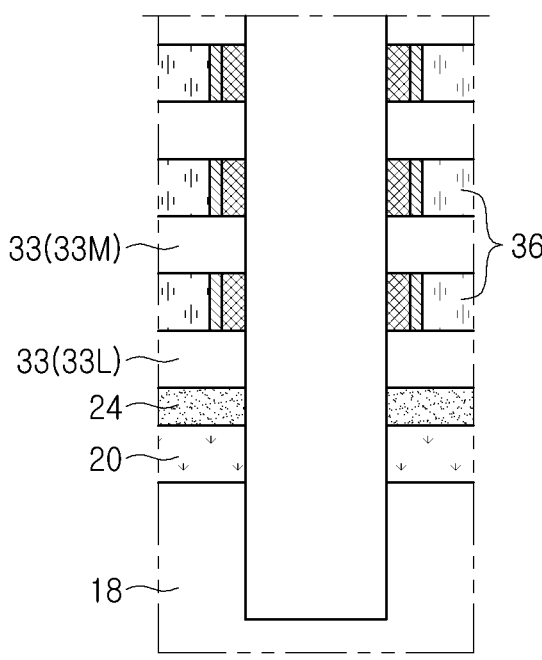
Figure 7D:
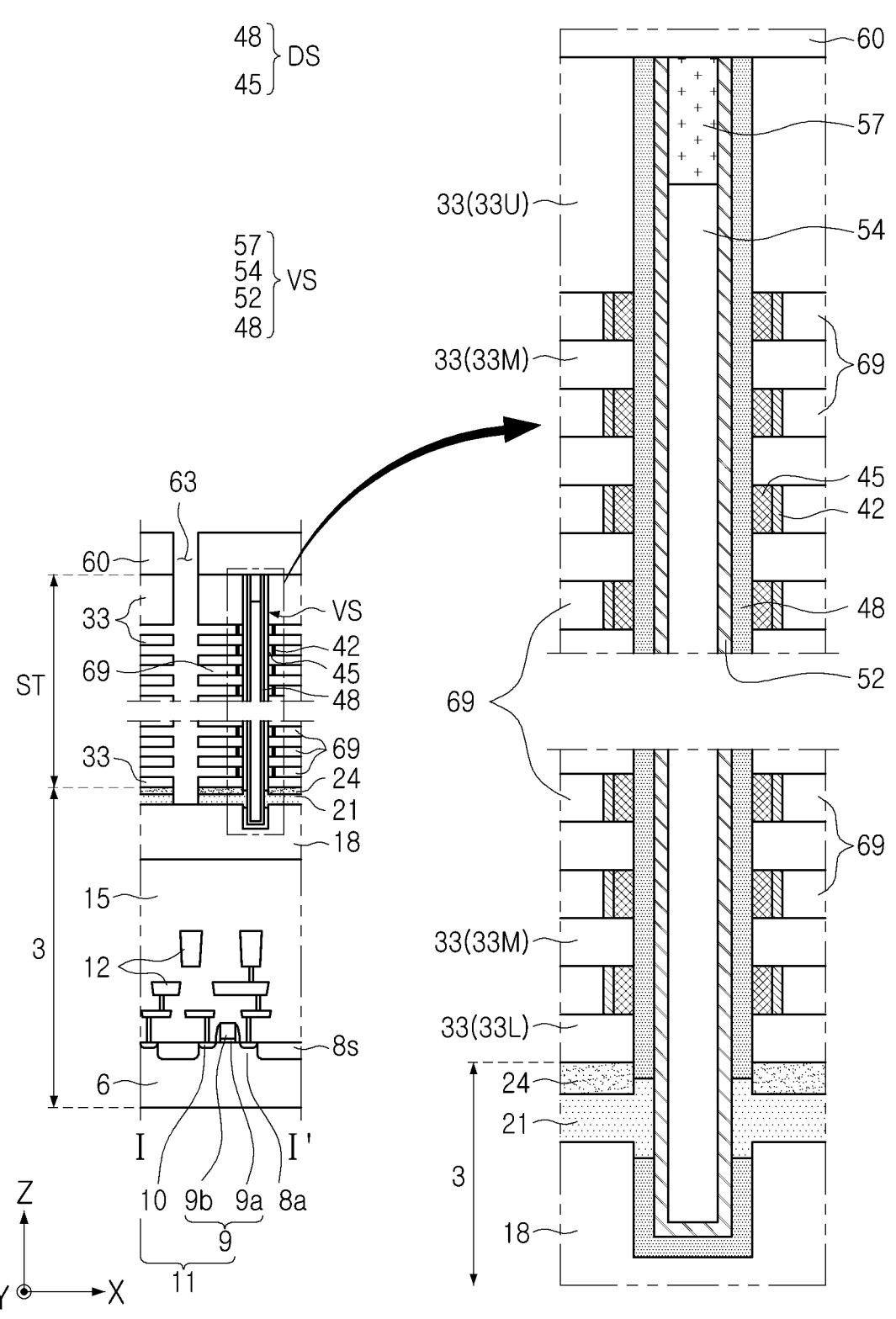

FIGS. 7A and 7D are cross-sectional views schematically illustrating a region taken along line I-I' of FIG. 1, and FIGS. 7B and 7C are partially enlarged cross-sectional views illustrating a portion of FIG. 7A.

Referring to FIG. 7A, a lower structure 3 may be formed. The lower structure 3 may include a substrate 6, an device isolation region 8s defining an active region 8a disposed on the substrate 6, a peripheral circuit 11 disposed on the substrate 6, a circuit interconnection structure 12 disposed on the peripheral circuit 11, a peripheral insulating structure 15 covering the peripheral circuit 11 and the circuit interconnection structure 12 disposed on the substrate 6, and a plate layer 18 disposed on the peripheral insulating structure 15.

The lower structure 3 may further include a sacrificial horizontal layer 20 disposed on the plate layer 18 and a second horizontal pattern 24 disposed on the sacrificial horizontal layer 20.

A mold structure 30 may be formed on the lower structure 3. The mold structure 30 may include interlayer insulating layers 33 and sacrificial gate layers 36 that are alternately and repeatedly stacked.

The sacrificial gate layers 36 may be formed of a material different from that of the interlayer insulating layers 33. For example, the sacrificial gate layers 36 may be formed of silicon nitride, and the interlayer insulating layers 33 may be formed of silicon oxide. For another example, the sacrificial gate layers 36 may be formed of a conductive material.

Among the interlayer insulating layers 33 and the sacrificial gate layers 36, the lowermost layer may be the lower interlayer insulating layer 33L, and the uppermost layer may be the upper interlayer insulating layer 33U.

Referring to FIG. 7B, a hole 39 penetrating through the mold structure 30 and extending downwardly to penetrate through the second horizontal pattern 24 and the sacrificial horizontal layer 20 and exposing the plate layer 18 may be formed.

The interlayer insulating layers 33 and the sacrificial gate layers 36 may be exposed through the hole 39.

The sacrificial gate layers 36 exposed by the hole 39 may be partially etched to form expanded openings 39e.

Referring to FIG. 7C, dielectric layers 42 and data storage patterns 45 may be sequentially formed in the expanded openings 39e. The dielectric layers 42 may contact the sacrificial gate layers 36.

For example, a dielectric layer may be formed in the hole 39 and the expanded openings 39e, and the dielectric layer may be partially etched to form the dielectric layers 42 remaining in the expanded openings 39e. The data storage patterns 45 may be formed in the expanded openings 39e in which the dielectric layers 42 are formed.

For another example, the dielectric layers 42 may be formed by oxidizing the sacrificial gate layers 36 exposed by the expanded openings 39e, and the data storage patterns 45 may be formed in the expanded openings 39e.

For another example, the dielectric layers 42 (e.g., dielectric layer 42a in FIG. 4B) covering at least an inner wall of each of the expanded openings 39e may be formed, and the data storage patterns 45 may be formed in the expanded openings 39e in which the dielectric layers 42 (e.g., dielectric layer 42a in FIG. 4B) are formed.

Referring to FIG. 7D, the data storage layer 48 and the channel layer 52 may be sequentially formed to conformally cover an inner wall of the hole 39. For example, the data storage layer 48 may cover the data storage patterns 45 in the expanded openings 39e, and the channel layer 52 may cover an inner surface of the data storage layer 48.

A core pattern 54 partially filling the hole 39 may be formed on the channel layer 52, and a pad pattern 57 filling the remaining portion of the hole 39 may be formed on the core pattern 54.

A first upper insulating layer 60 may be formed on the mold structure (e.g., mold structure 30 in FIG. 7C), and a separation opening 63 may be formed that may penetrate through the first upper insulating layer 60, the mold structure (e.g., mold structure 30 in FIG. 7C), and the second horizontal pattern 24, exposing the sacrificial horizontal layer (e.g., sacrificial horizontal layer 20 in FIG. 7C). The sacrificial horizontal layer (e.g., sacrificial horizontal layer 20 in FIG. 7C) exposed by the separation opening 63 may be removed, the data storage layer 48 may be etched so that the channel layer 52 is exposed to form an empty space, and the empty space may be filled with the first horizontal pattern 21. The first horizontal pattern 21 may contact the channel layer 52.

Openings 69 may be formed by removing the sacrificial gate layers 36 exposed by the separation opening 63.

In an example embodiment, when the sacrificial gate layers 36 are formed of a conductive material (e.g., doped polysilicon), the sacrificial gate layers 36 may remain as gate electrodes, without being removed.

Referring back to FIGS. 1, 2A, and 2B, gate electrodes 75 may be formed by filling the openings 69 of FIG. 7D.

For example, in a case in which the forming of the dielectric layers 42 described above with reference to FIG. 7C is omitted, the dielectric layers 42 may be formed by oxidizing the data storage patterns 45 exposed by the openings (e.g., openings 69 in FIG. 7D) before the gate electrodes 75 are formed.

For another example, in a case in which the forming of the dielectric layers 42 described above with reference to FIG. 7C is omitted, the dielectric layers (e.g., dielectric layer 42b in FIG. 4C) covering an inner wall of each of the openings (e.g., openings 69 in FIG. 7D) may be formed before the gate electrodes 75 are formed.

For another example, without omitting the forming of the dielectric layers 42 described above with reference to FIG. 7C, the dielectric layers (e.g., second dielectric layer 42_2 in FIG. 4D or second dielectric layer 42_2' in FIG. 4E) covering the inner wall of each of the openings (e.g., openings 69 in FIG. 7D) may be formed before the gate electrodes 75 are formed.

In some embodiments, the separation structure 78 may be formed to fill the separation opening (e.g., separation opening 63 in FIG. 7D).

Alternatively or additionally, a second upper insulating layer (e.g., second upper insulating layer 81 of FIG. 2A) may be formed on the first upper insulating layer 60. A contact plug (e.g., contact plug 84 of FIG. 2A) penetrating through the first upper insulating layer 60 and the second upper insulating layer 81 may be formed. The contact plug may be electrically connected (e.g., coupled) to the vertical structure VS. A bit line (e.g., bit line 87 of FIG. 2A) may be formed such that the bit line is electrically connected to the contact plug 84 on the second upper insulating layer 81.

A data storage system including a semiconductor device according to an example embodiment of the present disclosure, is described with reference to FIGS. 8, 9 and 10.

Figure 8:
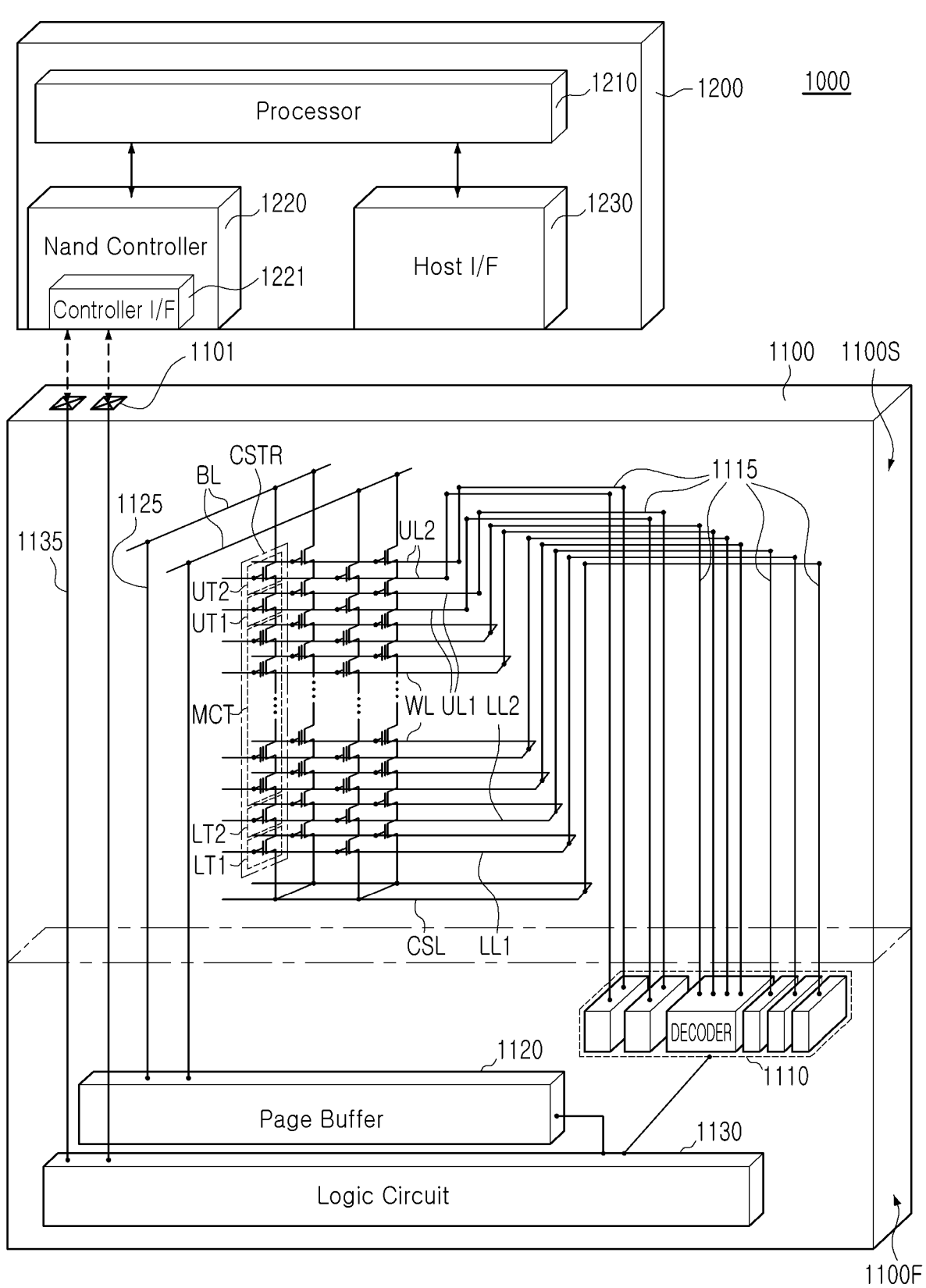
FIG. 8 is a diagram schematically illustrating a data storage system including a semiconductor device, according to an example embodiment of the present disclosure.

FIG. 8 is a diagram schematically illustrating a data storage system including a semiconductor device, according to an example embodiment of the present disclosure.

Referring to FIG. 8, a data storage system 1000, according to an example embodiment of the present disclosure, may include a semiconductor device 1100 and a controller 1200 electrically connected to the semiconductor device 1100 to control the semiconductor device 1100. The data storage system 1000 may be a storage device including the semiconductor device 1100 and/or an electronic device including the storage device. For example, the data storage system 1000 may be a solid state drive (SSD) device including the semiconductor device 1100, a universal serial bus (USB), a computing system, a medical device, or a communications device.

The semiconductor device 1100 depicted in FIG. 8 may include or may be similar in many respects to semiconductor device 200 depicted in FIG. 6, the semiconductor device 100 of FIG. 5, and the semiconductor device 1 described above with reference to FIGS. 1 to 4E, and may include additional features not mentioned above.

In an example embodiment, the data storage system 1000 may be an electronic system storing data.

The semiconductor device 1100 may be a nonvolatile memory device. For example, the semiconductor device 1100 may be a semiconductor device according to any one of the example embodiments described above with reference to FIGS. 1 to 6. The semiconductor device 1100 may include a first structure 1100F and a second structure 1100S on the first structure 1100F.

The first structure 1100F may be a peripheral circuit structure including a decoder circuit 1110, a page buffer 1120, and a logic circuit 1130. For example, the first structure 1100F may include the peripheral circuit structures (e.g., the substrate 6, the peripheral circuit 11, the circuit interconnection structure 12, and the peripheral insulating structure 15 of FIG. 2A or the substrate 206, the peripheral circuit 211, the circuit interconnection structure 212, and the peripheral insulating structure 215 of FIG. 6) described above. The peripheral circuit (e.g., the peripheral circuit 11 of FIG. 2A or the peripheral circuit 211 of FIG. 6) described above may be a transistor including the decoder circuit 1110, the page buffer 1120, and the logic circuit 1130.

The second structure 1100S may be a memory structure including a bit line BL, a common source line CSL, word lines WL, first gate upper line UL1, second gate upper line UL2, first gate lower line LL1, second gate lower line LL2, and memory cell strings CSTR disposed between the bit line BL and the common source line CSL.

The source structures (e.g., the plate layer 18, the first horizontal pattern 21, and the second horizontal pattern 24) described above may include a silicon layer having an N-type conductivity, and at least a portion of the source structures may configure the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number (e.g., quantity) of lower transistors LT1 and LT2 and the number of upper transistors UT1 and UT2 may be variously modified according to example embodiments.

As described above with reference to FIG. 2B, the plurality of memory cell transistors MCTs may include the word lines 75M, the channel layer 53, the data storage layer 48, the data storage patterns 45, and the dielectric layers 42 disposed between the word lines 75M and the channel layer 53.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The gate electrodes (e.g., gate electrodes 75 of FIG. 2B or FIG. 3) described above may constitute the gate lower lines LL1 and LL2, the word lines WL, and the gate upper lines UL1 and UL2. For example, the intermediate gate layers (75M in FIG. 2B) may constitute the word lines WL.

The common source line CSL, the first gate lower line LL1, the second gate lower line LL2, the word lines WL, the first gate upper line UL1, and the second gate upper line UL2 may be electrically connected to the decoder circuit 1110 through first connection wires 1115 extending from the first structure 1100F to the second structure 1100S.

The bit lines BL may be electrically connected to the page buffer 1120 through second connection lines 1125 extending from the first structure 1100F to the second structure 1100S. The bit lines BL may be the bit lines 87 of FIG. 2A described above.

In the first structure 1100F, the decoder circuit 1110 and the page buffer 1120 may execute a control operation on at least one selected memory cell transistor MCT among the plurality of memory cell transistors MCT. The decoder circuit 1110 and the page buffer 1120 may be controlled by a logic circuit 1130.

The semiconductor device 1100 may further include an input/output (I/O) pad 1101. The semiconductor device 1100 may communicate with the controller 1200 through the I/O pad 1101 that may be electrically connected to the logic circuit 1130. The I/O pad 1101 may be electrically connected to the logic circuit 1130 through an I/O connection line 1135 extending from the first structure 1100F to the second structure 1100S. Accordingly, the controller 1200 may be electrically connected to the semiconductor device 1100 through the I/O pad 1101, and may control the semiconductor device 1100.

The controller 1200 may include a processor 1210, a NAND controller 1220, and a host interface 1230. In some example embodiments, the data storage system 1000 may include a plurality of semiconductor devices 1100, and in this case, the controller 1200 may control the plurality of semiconductor devices 1100.

The processor 1210 may control the overall operation of the data storage system 1000, including the controller 1200. The processor 1210 may operate according to predetermined firmware, and may access the semiconductor device 1100 by controlling the NAND controller 1220. The NAND controller 1220 may include a NAND controller interface 1221 for processing communications with the semiconductor device 1100. Through the NAND controller interface 1221, the NAND controller 1220 may transmit a control command for controlling the semiconductor device 1100, data to be written to the memory cell transistors MCT of the semiconductor device 1100, and/or data to be read from the memory cell transistors MCT of the semiconductor device 1100. The host interface 1230 may provide a communication function between the data storage system 1000 and an external host. Upon receiving a control command from an external host through the host interface 1230, the processor 1210 may control the semiconductor device 1100 in response to the control command.

Figure 9:
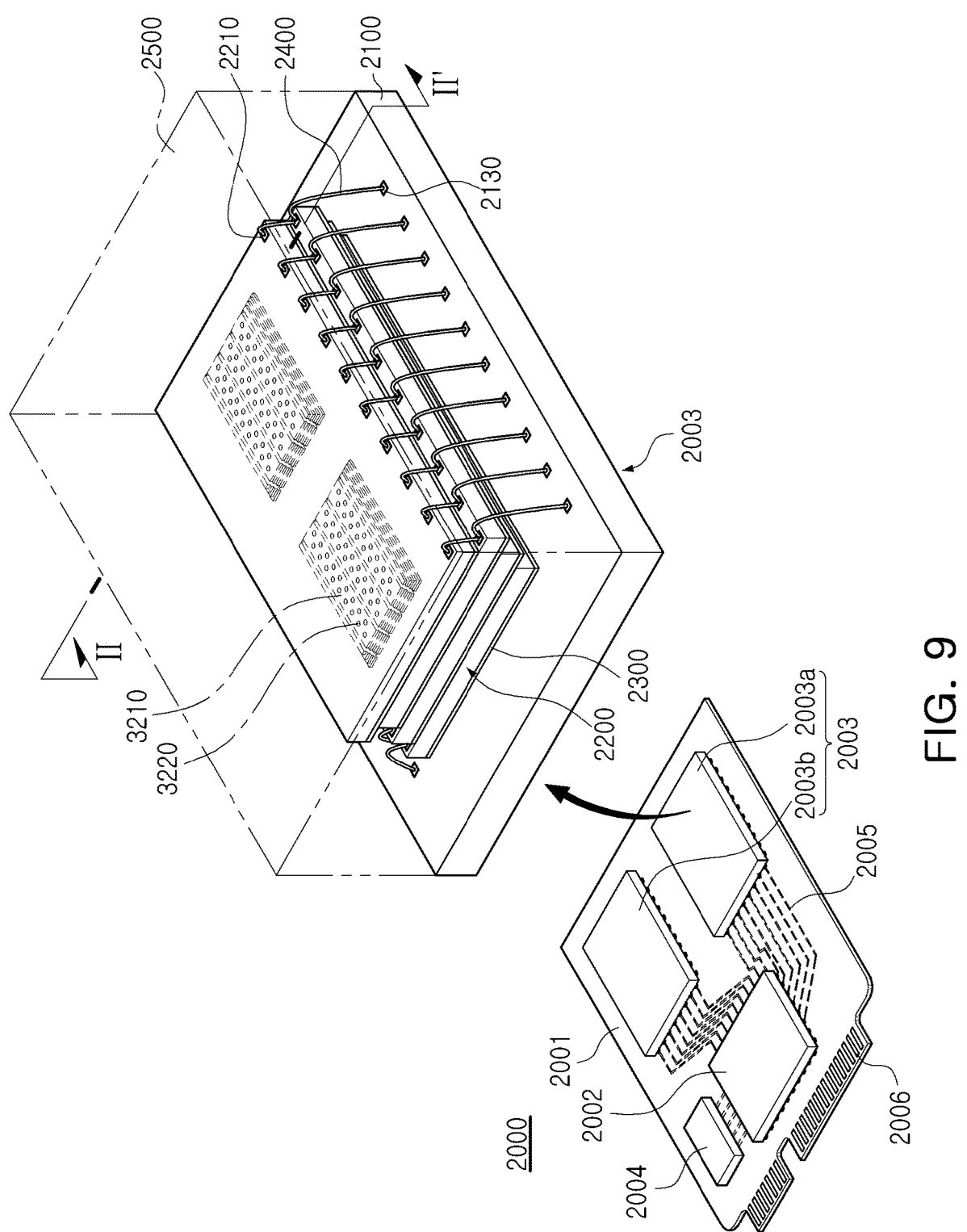
FIG. 9 is a perspective view schematically illustrating a data storage system including a semiconductor device, according to an example embodiment of the present disclosure.

FIG. 9 is a perspective view schematically illustrating a data storage system including a semiconductor device, according to an example embodiment of the present disclosure.

Referring to FIG. 9, a data storage system 2000, according to an example embodiment of the present disclosure, may include a main board 2001, a controller 2002 mounted on the main board 2001, one or more semiconductor packages 2003, and dynamic random access memory (DRAM) 2004. The semiconductor package 2003 and the DRAM 2004 may be connected to the controller 2002 by interconnection patterns 2005 formed on the main board 2001.

The main board 2001 may include a connector 2006 including a plurality of pins coupled to an external host. The number and arrangement of the plurality of pins in the connector 2006 may vary depending on a communication interface between the data storage system 2000 and the external host. In example embodiments, the data storage system 2000 may communicate with an external host according to any one of interfaces, such as, but not limited to, a universal serial bus (USB), a peripheral element interconnect express (PCI-Express), a serial advanced technology attachment (SATA), and an M-Phy for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to and/or read data from the semiconductor package 2003, and may improve an operating speed of the data storage system 2000.

The DRAM 2004 may be a buffer memory for reducing a speed difference between the semiconductor package 2003 as a data storage space and an external host. The DRAM 2004 included in the data storage system 2000 may also operate as a cache memory, and/or may provide a space for temporarily storing data in a control operation for the semiconductor package 2003. When the DRAM 2004 is included in the data storage system 2000, the controller 2002 further may include a DRAM controller (not shown) for controlling the DRAM 2004 in addition to the NAND controller for controlling the semiconductor package 2003.

The semiconductor package 2003 may include first semiconductor package 2003a and second semiconductor package 2003b, which may be spaced apart from each other. Each of the first semiconductor package 2003a and the second semiconductor package 2003b may be a semiconductor package including a plurality of semiconductor chips 2200. Each of the semiconductor chips 2200 may include the semiconductor device according to any one of the example embodiments described above with reference to FIGS. 1 to 6.

Each of the first semiconductor package 2003a and the second semiconductor package 2003b may include a package substrate 2100, semiconductor chips 2200 disposed on the package substrate 2100, adhesive layers 2300 disposed on lower surfaces of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an I/O pad 2210.

In example embodiments, the connection structure 2400 may be a bonding wire electrically connecting the I/O pad 2210 to the package upper pads 2130. Accordingly, in each of the first semiconductor package 2003a and the second semiconductor package 2003b, the semiconductor chips 2200 may be electrically connected to each other by a bonding wire method, and may be electrically connected to the package upper pads 2130 of the package substrate 2100. According to some example embodiments, in each of the first semiconductor package 2003a and the second semiconductor package 2003b, the semiconductor chips 2200 may be electrically connected to each other by a connection structure including a through-silicon via (TSV) (not shown), instead of the connection structure 2400 based on a bonding wire method.

In example embodiments, the controller 2002 and the semiconductor chips 2200 may be included in one package. For example, the controller 2002 and the semiconductor chips 2200 may be mounted on a separate interposer substrate different from the main board 2001, and the controller 2002 and the semiconductor chips 2200 may be connected to each other via an interconnection formed in the interposer substrate.

Figure 10:
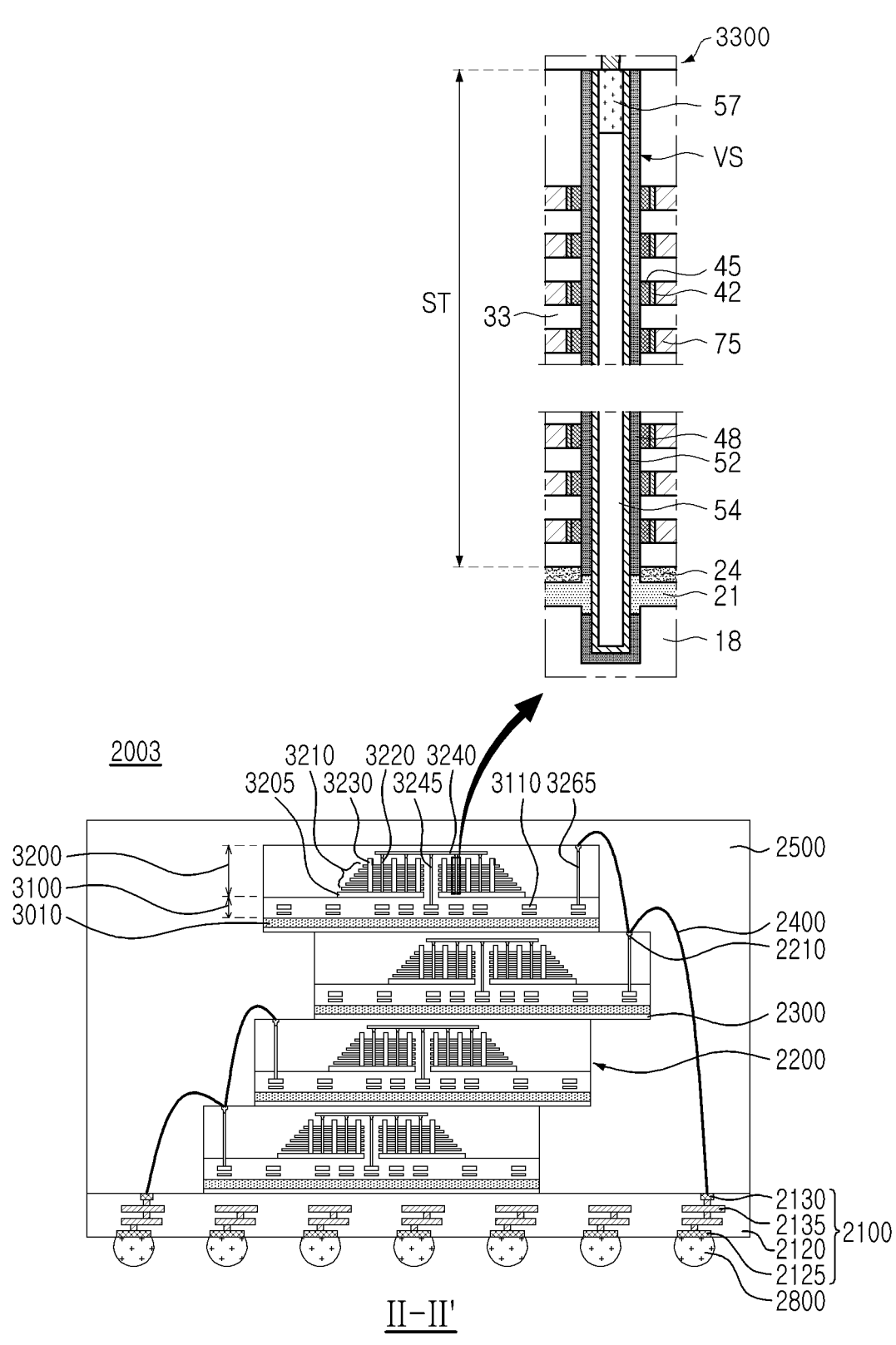
FIG. 10 is a cross-sectional view schematically illustrating a data storage system including a semiconductor device, according to an example embodiment of the present disclosure.

FIG. 10 is a cross-sectional view schematically illustrating a semiconductor package, according to an example embodiment of the present disclosure. FIG. 10 illustrates an example embodiment of the semiconductor package 2003 of FIG. 9, and schematically illustrates a region of the semiconductor package 2003 of FIG. 9, taken along line II-II'.

Referring to FIGS. 9 and 10, in the semiconductor package 2003, the package substrate 2100 may be a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface thereof, and internal interconnections 2135 electrically connecting the upper pads 2130 to the lower pads 2125 inside the package substrate body portion 2120. The upper pads 2130 may be electrically connected to the connection structures 2400. The lower pads 2125 may be connected to the interconnection patterns 2005 of the main board 2010 of the data storage system 2000 through conductive connection portions 2800.

Each of the semiconductor chips 2200 may include a semiconductor substrate 3010 and a first structure 3100 and a second structure 3200 that are sequentially stacked on the semiconductor substrate 3010. The first structure 3100 may include a peripheral circuit region including peripheral interconnections 3110. The second structure 3200 may include a common source line 3205, a stack structure 3210 on the common source line 3205, memory channel structures 3220 and separation structures 3230 penetrating through the stack structure 3210, bit lines 3240 electrically connected to the memory channel structures 3220, and gate contact plugs (e.g., contact plug 84 in FIG. 2A) electrically connected to the word lines WL of the stack structure 3210. The first structure 3100 may include the first structure 1100F of FIG. 8, and the second structure 3200 may include the second structure 1100S of FIG. 8.

Each of the semiconductor chips 2200 may include a through-interconnection 3245 electrically connected to the peripheral interconnections 3110 of the first structure 3100 and extending into the second structure 3200. The through-interconnection 3245 may penetrate through the stack structure 3210 and may be further disposed outside the stack structure 3210.

Each of the semiconductor chips 2200 may further include an I/O connection wiring 3265 electrically connected to the peripheral interconnections 3110 of the first structure 3100 and extending into the second structure 3200 and an I/O pad 2210 electrically connected to the I/O connection wiring 3265.

In FIG. 10, a partially enlarged portion indicated by reference numeral 3300 indicates that the semiconductor chips 2200 of FIG. 10 may be modified to include the partially enlarged portion of the cross-sectional structure as in FIG. 2A. Accordingly, each of the semiconductor chips 2200 may include the semiconductor device 1 according to any one of the example embodiments described above with reference to FIGS. 1 to 6.

According to example embodiments, a semiconductor device including a data storage layer and a data storage pattern disposed between a gate electrode and a channel layer and formed of different materials may be provided. Since the semiconductor device may include a data storage pattern capable of storing data using charge injection or a charge trap and a data storage layer capable of storing data using a polarization state, a memory window of the semiconductor device may be increased, endurance and retention characteristics of the semiconductor device may be improved, and an operating voltage of the semiconductor device may be lowered, when compared to related semiconductor devices. In addition, in the semiconductor device, since the memory window may be increased, a multibit operation may be secured.

While example embodiments have been illustrated and described above, it will be apparent to those skilled in the art that modifications and variations could be made without departing from the scope of the present disclosure as defined by the appended claims.

What is claimed is:

1. A semiconductor device, comprising:
a stack structure including interlayer insulating layers and gate electrodes, wherein the interlayer insulating layers and the gate electrodes are alternately and repeatedly stacked in a first direction;
a channel layer disposed inside a hole penetrating through the stack structure;
a data storage layer disposed between the stack structure and the channel layer;

data storage patterns disposed between the data storage layer and the gate electrodes; and
dielectric layers disposed between the data storage patterns and the gate electrodes,
wherein a first material of the data storage layer is different from a second material of the data storage patterns,
wherein the data storage patterns are stacked and spaced apart from each other in the first direction,
wherein an upper end of the data storage layer is at a higher level than an uppermost data storage pattern of the data storage patterns, and
wherein a lower end of the data storage layer is at a lower level than a lowermost data storage pattern of the data storage patterns.

2. The semiconductor device of claim 1, wherein the data storage layer includes a ferroelectric layer.

3. The semiconductor device of claim 2, wherein the data storage patterns are floating conductive patterns.

4. The semiconductor device of claim 1, further comprising:
a buffer layer disposed between the channel layer and the data storage layer,
wherein a first thickness in a second direction of the buffer layer is less than a second thickness in the second direction of the channel layer, and
wherein the first thickness is less than a third thickness in the second direction of the data storage layer.

5. The semiconductor device of claim 1, wherein
a first thickness in a second direction of the data storage layer exceeds a second thickness in the second direction of each dielectric layer of the dielectric layers,
a third thickness in the second direction of each data storage pattern of the data storage patterns exceeds the second thickness, and
the third thickness is a distance in the second direction between a first side surface and a second side surface of each data storage pattern of the data storage patterns, the first side surface being opposite to the second side surface in the second direction.

6. The semiconductor device of claim 1, wherein
each dielectric layer of the dielectric layers is provided to have a first thickness in a second direction between approximately 10 angstrom (Å) and approximately 50 Å,
a second thickness in the second direction of the data storage layer is between approximately 50 Å and approximately 150 Å, and
each data storage pattern of the data storage patterns is provided to have a third thickness in the second direction between approximately 50 Å and approximately 150 Å.

7. The semiconductor device of claim 1, wherein the data storage patterns are disposed between the interlayer insulating layers and vertically overlap the interlayer insulating layers.

8. The semiconductor device of claim 1, further comprising:
a peripheral circuit structure,
wherein the peripheral circuit structure vertically overlaps the stack structure.

9. The semiconductor device of claim 1, further comprising:
a core pattern including an insulating material and disposed inside the hole;
a pad pattern contacting the channel layer and disposed on the core pattern;

a contact plug disposed on the pad pattern; and a bit line disposed on the contact plug, wherein the channel layer is disposed between the core pattern and the data storage layer.

10. A semiconductor device, comprising:

a core pattern including an insulating material;

a channel layer surrounding a side surface of the core pattern;

a data storage layer surrounding an outer surface of the channel layer;

a data storage pattern surrounding an outer surface of the data storage layer;

a first dielectric layer surrounding an outer surface of the data storage pattern;

a gate electrode surrounding an outer surface of the first dielectric layer;

a first interlayer insulating layer; and a second interlayer insulating layer disposed at a higher level than the first interlayer insulating layer, wherein the core pattern at least partially penetrates through the first interlayer insulating layer and the second interlayer insulating layer in a vertical direction, wherein the gate electrode, the first dielectric layer, and the data storage pattern are disposed between an upper surface of the first interlayer insulating layer and a lower surface of the second interlayer insulating layer, wherein the data storage pattern is disposed at a lower level than the second interlayer insulating layer and is disposed at a higher level than the first interlayer insulating layer, wherein an upper end of the data storage layer is at a higher level than the second interlayer insulating layer, wherein a lower end of the data storage layer is at a lower level than the first interlayer insulating layer, and wherein a first material of the data storage layer is different from a second material of the data storage pattern.

11. The semiconductor device of claim 10, wherein the data storage layer includes a ferroelectric layer, and the data storage pattern includes at least one of a conductive material and a charge trap material.

12. The semiconductor device of claim 10, wherein a first thickness in a first direction of the first dielectric layer is less than a second thickness in the first direction of the data storage layer, the first thickness is less than a third thickness in the first direction of the data storage pattern, and the second thickness is a distance between a first side surface and a second side surface of the data storage pattern, the first side surface being opposite to the second side surface in the first direction.

13. The semiconductor device of claim 10, further comprising:

a buffer layer disposed between the channel layer and the data storage layer, wherein a first thickness in a first direction of the buffer layer is less than a second thickness in the first direction of the channel layer, and wherein the first thickness is less than a third thickness in the first direction of the data storage layer.

14. The semiconductor device of claim 10, wherein the first dielectric layer extends from a portion interposed between the gate electrode and the data storage pattern to cover upper and lower surfaces of the data storage pattern.

15. The semiconductor device of claim 10, wherein the first dielectric layer extends from a portion interposed between the gate electrode and the data storage pattern to cover upper and lower surfaces of the gate electrode.

16. The semiconductor device of claim 10, further comprising a second dielectric layer disposed between the gate electrode and the first dielectric layer.

17. The semiconductor device of claim 10, further comprising a peripheral circuit structure vertically overlapping the gate electrode.

18. A data storage system, comprising:

a semiconductor device including an input/output (I/O) pad; and a controller electrically coupled to the semiconductor device via the I/O pad and configured to control the semiconductor device using the I/O pad, wherein the semiconductor device further includes:

a stack structure including interlayer insulating layers and gate electrodes, wherein the interlayer insulating layers and the gate electrodes are alternately and repeatedly stacked;

a channel layer disposed inside a hole penetrating through the stack structure;

a data storage layer disposed between the stack structure and the channel layer;

data storage patterns disposed between the data storage layer and the gate electrodes; and dielectric layers disposed between the data storage patterns and the gate electrodes, wherein a first material of the data storage layer is different from a second material of the data storage patterns, wherein the data storage patterns are stacked and spaced apart from each other in a vertical direction, wherein an upper end of the data storage layer is at a higher level than an uppermost data storage pattern of the data storage patterns, and wherein a lower end of the data storage layer is at a lower level than a lowermost data storage pattern of the data storage patterns.

19. The data storage system of claim 18, wherein the data storage layer includes a ferroelectric layer, the data storage patterns include at least one of a conductive material and a charge trap material, a first thickness in a first direction of each dielectric layer of the dielectric layers is less than a second thickness in the first direction of the data storage layer, the first thickness is less than a third thickness in the first direction of each data storage pattern of the data storage patterns, and the third thickness is a distance in the first direction between a first side surface and a second side surface of the data storage patterns, the first side surface being opposite to the second side surface in the first direction.

* * * * *